US008247321B2

(12) United States Patent
Matsumoto et al.

(10) Patent No.: US 8,247,321 B2
(45) Date of Patent: Aug. 21, 2012

(54) METHOD OF MANUFACTURING SEMICONDUCTOR DEVICE, SEMICONDUCTOR DEVICE, ELECTRONIC INSTRUMENT, SEMICONDUCTOR MANUFACTURING APPARATUS, AND STORAGE MEDIUM

(75) Inventors: Kenji Matsumoto, Nirasaki (JP); Hitoshi Itoh, Nirasaki (JP); Hiroshi Sato, Nirasaki (JP); Junichi Koike, Sendai (JP); Koji Neishi, Nirasaki (JP)

(73) Assignees: Tokyo Electron Limited, Tokyo (JP); National University Corporation Tohoku University, Miyagi-ken (JP)

( * ) Notice: Subject to any disclaimer, the term of this patent is extended or adjusted under 35 U.S.C. 154(b) by 90 days.

(21) Appl. No.: 12/864,824

(22) PCT Filed: Jan. 20, 2009

(86) PCT No.: PCT/JP2009/050753
§ 371 (c)(1),
(2), (4) Date: Nov. 17, 2010

(87) PCT Pub. No.: WO2009/096264
PCT Pub. Date: Aug. 6, 2009

(65) Prior Publication Data
US 2011/0049718 A1    Mar. 3, 2011

(30) Foreign Application Priority Data

Jan. 28, 2008 (JP) .................................. 2008-015803
Aug. 26, 2008 (JP) .................................. 2008-217257

(51) Int. Cl.
*H01L 21/4763* (2006.01)
(52) U.S. Cl. ................ 438/627; 257/E21.584; 257/751; 257/758; 438/643; 438/687

(58) Field of Classification Search ............. 257/E21.17, 257/E21.584, 751, 763, 758, 762; 438/584, 438/653, 625, 638, 643, 627, 685–687, 694; 118/696, 697
See application file for complete search history.

(56) References Cited

U.S. PATENT DOCUMENTS 6,271,136 B1 * 8/2001 Shue et al. .................... 438/687
(Continued)

FOREIGN PATENT DOCUMENTS

JP    11-200048    7/1999
(Continued)

OTHER PUBLICATIONS

International Search Report mailed on Mar. 31, 2009.

*Primary Examiner* — Chris Chu
(74) *Attorney, Agent, or Firm* — Smith, Gambrell & Russell, LLP

(57) ABSTRACT

When a barrier film is formed on an exposed surface of an interlayer insulation film on a substrate, the interlayer insulation film having a recess formed therein, and a metal wiring to be electrically connected to a metal wiring in a lower layer is formed in the recess, a barrier film having an excellent step coverage can be formed and increase of a wiring resistance can be restrained. An oxide film on a surface of the lower copper wiring exposed to a bottom surface of the interlayer insulation film is reduced or edged so as to remove oxygen on the surface of the copper wiring. Then, by supplying an organic metal compound containing manganese and containing no oxygen, generation of manganese oxide as a self-forming barrier film is selectively allowed on an area containing oxygen, such as a sidewall of the recess and a surface of the interlayer insulation film, while generation of the manganese oxide is not allowed on the surface of the copper wiring. Thereafter, copper is embedded in the recess.

48 Claims, 23 Drawing Sheets

U.S. PATENT DOCUMENTS

| | | | |
|---|---|---|---|
| 6,746,957 B2 * | 6/2004 | Ohtsuka et al. | 438/687 |
| 6,797,608 B1 * | 9/2004 | Lin | 438/627 |
| 6,905,964 B2 * | 6/2005 | Lim et al. | 438/687 |
| 7,176,571 B2 * | 2/2007 | Cheng et al. | 257/750 |
| 7,531,451 B2 * | 5/2009 | Lee | 438/647 |
| 2002/0031911 A1 * | 3/2002 | Pyo | 438/687 |
| 2002/0089063 A1 * | 7/2002 | Ahn et al. | 257/762 |
| 2005/0003660 A1 * | 1/2005 | Murakawa et al. | 438/643 |
| 2005/0023691 A1 * | 2/2005 | Watanabe et al. | 257/758 |
| 2005/0054202 A1 * | 3/2005 | Pan et al. | 438/694 |
| 2005/0142858 A1 * | 6/2005 | Han | 438/638 |
| 2005/0218519 A1 | 10/2005 | Koike et al. | 257/756 |
| 2007/0048931 A1 | 3/2007 | Shimizu et al. | 438/243 |
| 2007/0173055 A1 | 7/2007 | Ohtsuka et al. | 438/627 |
| 2011/0237066 A1 * | 9/2011 | Sato et al. | 438/627 |

FOREIGN PATENT DOCUMENTS

| | | |
|---|---|---|
| JP | 2005-277390 | 10/2005 |
| JP | 2007-67107 | 3/2007 |
| JP | 2007-157959 | 6/2007 |
| JP | 2007-173511 | 7/2007 |
| JP | 2007-221103 | 8/2007 |
| JP | 2007-287816 | 11/2007 |

* cited by examiner

METHOD OF MANUFACTURING SEMICONDUCTOR DEVICE, SEMICONDUCTOR DEVICE, ELECTRONIC INSTRUMENT, SEMICONDUCTOR MANUFACTURING APPARATUS, AND STORAGE MEDIUM

FIELD OF THE INVENTION

The present invention relates to a method of manufacturing a semiconductor device in which copper is embedded in a recess formed in an interlayer insulation film so as to form a copper wring, a semiconductor device manufactured by this method, an electronic instrument including the semiconductor device, a semiconductor manufacturing apparatus, and a storage medium storing the aforementioned method.

BACKGROUND ART

A multilayer wiring structure of a semiconductor device is formed by embedding a metal wiring in an interlayer insulation film. As a material of the metal wiring, copper (Cu) is used because of a small electro-migration and a low resistance. A damascene step is generally employed as a process for forming the multilayer wiring structure. As an interlayer insulation film, there are used films made of a silicon compound containing, e.g., silicon (Si) and oxygen (O) or carbon (C), as a low dielectric material, such as a SiO film, a SiOF film, a SiC film, a SiOC film, a SiCOH film, a SiCN film, a porous silica film, a porous methylsilsesquioxane film, a poly-arylene film, and a SILK (registered trademark) film, or a fluorocarbon film.

In this damascene step, an interlayer insulation film is firstly etched by plasma made of a process gas containing a CF-series gas and an oxygen gas, so that there is formed a recess which includes a trench in which a wiring to be disposed in a layer is embedded, and a via hole in which a connection wiring for connecting an upper wiring and a lower wiring is embedded. Thereafter, there is performed an ashing process using a plasma of oxygen gas, for example. Thus, a photoresist mask made of e.g., an organic matter, which has been used as a mask in the etching process, is removed. Then, since residues as byproducts generated by these plasma processes adhere to a side surface and a rear surface of a substrate, there is performed a wet cleaning process in which the substrate is immersed in, e.g., a HF solution (hydrofluoric acid) so as to remove the residues. After that, Cu is embedded in the recess by a CVD method or an electrolytic plating method.

When the CVD method is used, in order to suitably embed copper, it is preferable to form a very thin copper seed layer along a surface of the interlayer insulation film and an inner surface of the recess. On the other hand, when the electrolytic plating method is used, it is necessary to form a copper seed layer serving as an electrode on the surface of the interlayer insulation film and the recess. In addition, since copper is likely to diffuse in the interlayer insulation film, it is necessary to form a barrier film in the recess in order to prevent the copper diffusion.

Thus, there has been generally formed a barrier film made of, e.g., Ta/TaN and a copper seed layer by a sputtering method. However, as a wiring density is increased and an opening diameter of the recess is decreased, such a sputtering method provides a poor step coverage for the recess, so that films are resistant to adhere to a sidewall of the recess. In addition, since the sputtering process is performed twice (for Ta and TaN), the thickness of the film is increased. Thus, it is difficult to cope with the miniaturization of the wiring density. JP2005-277390A (especially paragraphs 0018 to 0020) describes a technique in which manganese (Mn) is deposited in a recess by the sputtering method, then copper is deposited, and thereafter the substrate is subjected to an annealing process, so that a self-forming barrier layer made of manganese oxide (MnOx (x: given positive number) and a copper wiring layer are formed. Surplus manganese remaining in the metal wiring diffuses to a layer above the metal wiring by the annealing process, and is removed by a subsequent CMP (Chemical Mechanical Polishing) step. In the above method, the manganese and, for example, oxygen contained in the interlayer insulation film react with each other by the annealing process, so that manganese oxide is generated. Since the manganese oxide is formed as a barrier film on an interface between the interlayer insulation film and the metal wiring, a very thin barrier film can be obtained.

However, as described above, in the sputtering method, a larger amount of manganese is deposited on the bottom surface of the recess, as compared with the sidewall thereof. Thus, there is a possibility that a sufficient amount of manganese might not adhere to the sidewall of the recess, whereby a required barrier function cannot be obtained. In addition, when a large amount of manganese remains on the bottom surface of the recess, it is difficult to remove the manganese even by the aforementioned annealing process. Since an electric resistance of manganese is larger than that of copper, the manganese remaining in the metal wiring results in increase of a wring resistance.

In addition, since an oxygen gas is used as a process gas in the above plasma process, the surface of the metal wiring exposed to the bottom surface of the recess is oxidized by the plasma of the oxygen gas. Moreover, since the wet cleaning following thereto is performed in an atmosphere, a natural oxide film is further formed on the surface of the metal wiring. When the above-described self-forming barrier film is formed on the substrate, the oxygen in the oxide film and the manganese react with each other to generate manganese oxide. The manganese oxide is an insulator which invites increase of the wiring resistance. Further, since the manganese oxide is in a passive state that is poor in reactivity, an additional step, such as a punch-through step, is required for removing the manganese oxide.

Although the above-described JP2005-277390A, JP2007-67107A (especially FIG. 3-1, and paragraphs 0028, 0029, and 0037), and JP11-200048A (especially paragraphs 0026 and 0036 to 0038) respectively describe the technique in which a film made of, e.g., a copper and manganese compound is formed in a recess of an interlayer insulation film, an oxide film formed on the surface of the metal wiring is not examined.

Note that, depending on the number valence of Mn, there are plural kinds of manganese oxides such as MnO, $Mn_3O_4$, $Mn_2O_3$, $MnO_2$, etc. Herein, these manganese oxides are collectively referred to as MnOx (x: given positive number).

DISCLOSURE OF THE INVENTION

The present invention has been made in view of the above circumstances. The object of the present invention is to provide a method of manufacturing a semiconductor device, a semiconductor manufacturing apparatus, and a storage medium, which are capable of, when a barrier film is formed on an exposed surface of an interlayer insulation film on a substrate, the interlayer insulation film having a recess formed therein, and a metal wiring to be electrically connected to a metal wiring in a lower layer is formed in the recess, forming a barrier film having an excellent step coverage, and of restraining increase of a wiring resistance.

A method of manufacturing a semiconductor device of the present invention is a method of manufacturing a semiconductor device, performed to a substrate including: an interlayer insulation film having a recess formed therein; and a lower metal wiring, in a lower layer, whose main component is a first metal, the lower metal wiring being exposed to a bottom surface of the recess; the method comprising: forming a barrier film, which is a compound of a second metal and is configured to restrain diffusion of the first metal, on an exposed surface of the interlayer insulation film, by supplying a steam of an organic metal compound containing the second metal so as to react the organic metal compound containing the second metal with a part of components of the interlayer insulation film; and then, embedding a metal wiring whose main component is the first metal in the recess.

It is preferable that in the forming of the barrier film, since the lower wiring layer does not contain a component that will react with the organic metal compound containing the second metal so as to form a compound of the second metal, the barrier film is not formed on the lower metal wiring exposed to the bottom surface of the recess.

It is preferable that before the forming of the barrier film, removing or reducing oxygen on the surface of the metal wiring by reducing or etching a metal oxide on a surface of the lower metal wiring whose main component is the first metal that is exposed to the bottom surface of the recess formed in the interlayer insulation film on the substrate.

It is preferable that between the forming of the barrier film and the embedding metal wiring whose main component is the first metal, a seed layer made of the first metal is formed on the surface of the interlayer insulation film and inside the recess.

It is preferable that the interlayer insulation film contains oxygen or carbon.

It is preferable that a part of components near the surface of the interlayer insulation film or in the interlayer insulation film is oxygen, a compound containing an oxygen atom such as water, or carbon.

It is preferable that the first metal is one or more metals selected from the group consisting of Al, Cu, and Ag.

It is preferable that the second metal is one or more metals selected from the group consisting of Mg, Al, Ti, V, Cr, Mn, Ni, Ge, Y, Zr, Nb, Tc, Rh, Pd, Sn, Re, and Pt.

It is preferable that in the forming of the substrate, the substrate is heated.

It is preferable that the organic metal compound containing the second metal does not contain oxygen.

It is preferable that the organic metal compound containing the second metal reacts and decomposes by a presence of oxygen.

It is preferable that the interlayer insulation film is made of one or more films selected from the group consisting of a SiO film, a SiOF film, a SiC film, a SiOC film, a SiCOH film, a SiCN film, a porous silica film, a porous methylsilsesquioxane film, a poly-arylene film, a SILK (registered trademark) film, and a fluorocarbon film.

It is preferable that the organic metal compound containing the second metal is made of one or more organic metal compounds selected from the group consisting of $Cp_2Metal$ [$Metal(C_5H_5)_2$], $(MeCp)_2Metal$ [$=Metal(CH_3C_5H_4)_2$], $(Me_5Cp)_2Metal[=Metal\ ((CH_3)_5C_5H_4)_2]$, $(EtCp)_2Metal[=Metal(C_2H_5C_5H_4)_2]$, $(i\text{-}PrCp)_2Metal\ [=Metal\ (C_3H_7C_5H_4)_2]$, $(t\text{-}BuCp)_2Metal[=Metal(C_4H_9C_5H_4)_2]$, $Metal(DMPD)\ (EtCp)$ [$=Metal(C_7H_{11}C_2H_5C_5H_4)$] (herein "Metal" means the second metal element).

It is preferable that the first metal is Cu and the second metal is Mn.

The method of manufacturing a semiconductor device may further comprises, after the forming of the barrier film, starting to supply a steam of an organic metal compound containing the first metal and then increasing the supply amount of the steam of the organic metal compound containing the first metal, while heating the substrate and supplying the steam of the organic metal compound containing the second metal, so as to form a contact layer in which a ratio of the first metal relative to the second metal is gradually increased toward a surface layer.

The metal oxide on the surface of the lower metal wiring may be generated when the substrate is transferred in an atmosphere. Alternatively, the metal oxide on the surface of the lower metal wiring may be generated by an etching process that supplies the interlayer insulation film with a plasma of a process gas containing oxygen so as to form the recess, the etching process being performed before the removing or reducing of the oxygen on the surface of the metal wiring.

The process that removes or reduces the oxygen on the surface of the metal wiring may be a process that supplies an organic acid to the recess. Alternatively, the process that removes or reduces the oxygen on the surface of the metal wiring may be a thermal process that supplies hydrogen to the recess or a process that etches the recess by sputtering with argon. It is preferable that the organic acid is formic acid.

The method of manufacturing a semiconductor device may further comprises a thermal (annealing) process after the embedding of the metal wiring.

The forming of the barrier film may include heating of the substrate at not less than 100° C. and less than 500° C.

It is preferable that the barrier film is amorphous, and that the barrier film is not more than 5 nm in a film thickness thereof.

A semiconductor device of the present invention is manufactured by one of the aforementioned methods of manufacturing a semiconductor device.

An electronic instrument of the present invention includes the aforementioned semiconductor device.

A semiconductor manufacturing apparatus of the present invention is a semiconductor manufacturing apparatus for performing one of the aforementioned manufacturing method according to claim 1, the semiconductor manufacturing apparatus comprising: a vacuum transfer chamber module including: a transfer chamber of a vacuum atmosphere to which a substrate is loaded; and substrate transfer unit disposed in the transfer chamber; a barrier-film forming module including: a processing vessel air-tightly connected to the vacuum transfer chamber module, the processing vessel having therein a table on which the substrate is placed; and a unit that supplies the substrate with a steam of an organic metal compound containing a second metal; the barrier-film forming module being configured to form a barrier film, which is a compound of the second metal and is configured to restrain diffusion of a first metal, on an exposed surface of an interlayer insulation film on the substrate, by unit of a reaction of a part of components of the interlayer insulation film with the organic metal compound containing the second metal; a first metal-wiring forming module including: a processing vessel air-tightly connected to the vacuum transfer chamber module, the processing vessel having therein a table on which the substrate is placed; a unit that heats the substrate; and a first metal-wiring forming unit that supplies the substrate with a steam of a material whose main component is a first metal so as to embed the material whose main component is the first metal in the recess; and a control device that controls the substrate transfer unit such that the substrate having loaded into the vacuum transfer chamber module is transferred to the barrier-film forming module, and then the substrate is transferred to the first metal-wiring forming module via the vacuum transfer chamber module.

It is preferable that the semiconductor manufacturing apparatus further comprises a pre-processing module air-tightly connected to the vacuum transfer chamber module, the pre-processing module including therein a reducing unit or a removing unit that reduces or etches a metal oxide on a surface of a lower metal wiring whose main component is a first metal, the surface being exposed to a bottom surface of a recess formed in the interlayer insulation film on the substrate; and before the substrate is transferred to the barrier-film forming module, the control device controls the substrate transfer unit such that the substrate is transferred to the pre-processing module via the vacuum transfer chamber module.

It is preferable that the semiconductor manufacturing apparatus further comprises a seed-layer forming module air-tightly connected to the vacuum transfer chamber module, the seed-layer forming module including therein a seed-layer forming unit that forms a seed layer whose main component is the first metal on the surface of the interlayer insulation film and inside the recess, and the control device controls the substrate transfer unit such that, after the substrate has been transferred to the barrier-film forming module and before the substrate is transferred to the first metal-wiring forming module, the substrate is transferred to the seed-layer forming module via the vacuum transfer chamber module.

It is preferable that the processing vessel of the barrier-film forming module also serves as the processing vessel of the first metal-wiring forming module.

It is preferable that the interlayer insulation film contains oxygen or carbon.

It is preferable that a part of components near the surface of the interlayer insulation film or in the interlayer insulation film is oxygen, a compound containing an oxygen atom such as water, or carbon.

It is preferable that the first metal is one or more metals selected from the group consisting of Al, Cu, and Ag.

It is preferable that the second metal is one or more metals selected from the group consisting of Mg, Al, Ti, V, Cr, Mn, Ni, Ge, Y, Zr, Nb, Tc, Rh, Pd, Sn, Re, and Pt.

The barrier-film forming module may include a unit that heats the substrate.

It is preferable that the organic metal compound containing the second metal does not contain oxygen. Alternatively, it is preferable that the organic metal compound containing the second metal reacts and decomposes by a presence of oxygen.

It is preferable that the interlayer insulation film is made of one or more films selected from the group consisting of a SiO film, a SiOF film, a SiC film, a SiOC film, a SiCOH film, a SiCN film, a porous silica film, a porous methylsilsesquioxane film, a poly-arylene film, a SILK (registered trademark) film, and a fluorocarbon film.

It is preferable that the organic metal compound containing the second metal is made of one or more organic metal compounds selected from the group consisting of $Cp_2$Metal [Metal$(C_5H_5)_2$], $(MeCp)_2$Metal [=Metal$(CH_3C_5H_4)_2$], $(Me_5Cp)_2$Metal[=Metal $((CH_3)_5C_5H_4)_2$], $(EtCp)_2$Metal[=Metal $(C_2H_5C_5H_4)_2$], $(i-PrCp)_2$Metal [=Metal $(C_3H_7C_5H_4)_2$], $(t-BuCp)_2$Metal[=Metal$(C_4H_9C_5H_4)_2$], Metal(DMPD) (EtCp) [=Metal$(C_7H_{11}C_2H_5C_5H_4)$] (herein "Metal" means the second metal element).

It is preferable that the first metal is Cu and the second metal is Mn.

It is preferable that the reducing unit or the removing unit is a unit that supplies an organic acid to the recess. Alternatively, It is preferable that the reducing unit or the removing unit is a unit that supplies hydrogen to the recess, or a unit that etches the recess by sputtering with argon. It is preferable that the organic acid is formic acid.

It is preferable that the semiconductor manufacturing apparatus further comprises an annealing unit air-tightly connected to the vacuum transfer chamber module, the annealing unit including therein a heating unit that heats the substrate, and the control device controls the substrate transfer unit such that, after the substrate has been transferred to the first metal-wiring forming module, the substrate is transferred to the annealing unit via the vacuum transfer chamber module.

The barrier-film forming module may include a heating unit that heats the substrate at not less than 100° C. and less than 500° C.

It is preferably that the barrier film is amorphous, and that the barrier film is not more than 5 nm in a film thickness thereof.

A storage medium of the present invention is a storage medium for use in a semiconductor manufacturing apparatus for processing a substrate, the storage medium storing a computer program executable on a computer, wherein the computer program includes a step group such that one of the aforementioned method of manufacturing a semiconductor device is performed.

According to the present invention, when a barrier film is formed on an exposed surface of an interlayer insulation film on a substrate, the interlayer insulation film having a recess formed therein, and a metal wiring to be electrically connected to a metal wiring in a lower layer is formed in the recess, a steam of an organic metal compound containing a second metal is supplied to the substrate so as to grow a composite of the second metal on the exposed surface of the interlayer insulation film, whereby a barrier film configured to restrain diffusion of the metal wiring whose main component is a first metal is formed on a sidewall of the recess and an upper surface of the interlayer insulation film. Thus, a film thickness of the barrier film can be made thin. In addition, the barrier film is formed by a CVD method, a step coverage can be improved. Thus, even when an opening size of the recess is narrow, a thin and uniform barrier film can be formed. In addition, even when the substrate has a pattern in which the recesses of different opening sizes are formed, such a barrier film can be formed. Thus, in a copper multilayer wiring, the barrier film can be applied both a local wiring and a global wiring. Moreover, since the copper multilayer wiring can be miniaturized, a working speed of a device can be improved. Simultaneously, a chip size can be reduced, the number of device chips obtained from one wafer W can be increased, to thereby decrease a cost required for the device. Further, since a working speed of the device is improved, a calculating speed or an information processing speed of an electronic instrument including the device can be accelerated. Furthermore, since the above barrier film can restrain diffusion of copper of the metal wiring, a leak current of the interlayer insulation film can be restrained. Since a reliability of the wiring can be improved, a life time of the electronic instrument including the device can be elongated. Still furthermore, since a required calculation can be performed by a smaller circuit, the device can be used in an information terminal such as a mobile phone which is desired to be made smaller.

MODE FOR CARRYING OUT THE INVENTION (Structure of Wafer)

Figure 1:
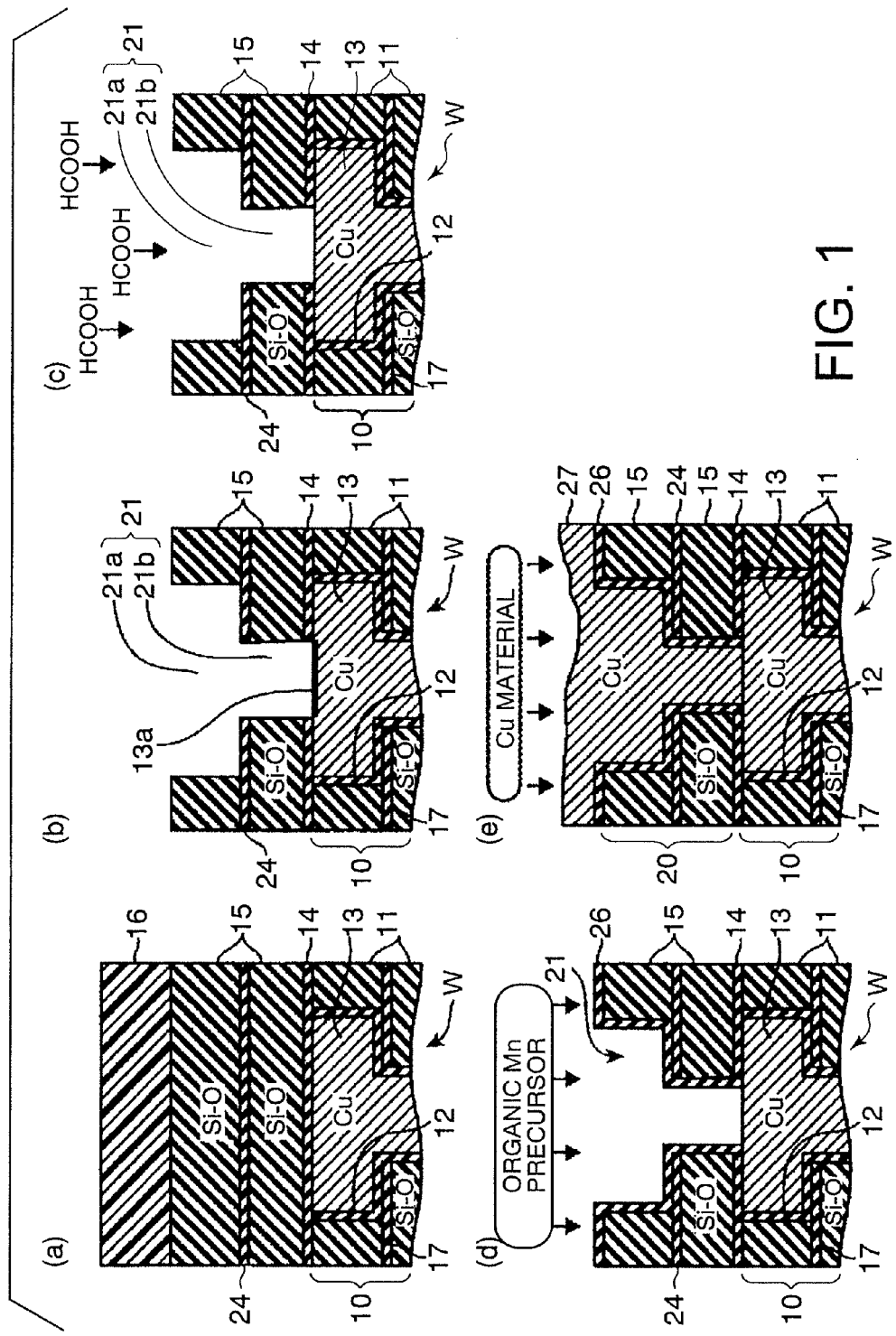
FIG. 1 is a process drawing showing an example of a method of manufacturing a semiconductor device of the present invention.
Figure 2:
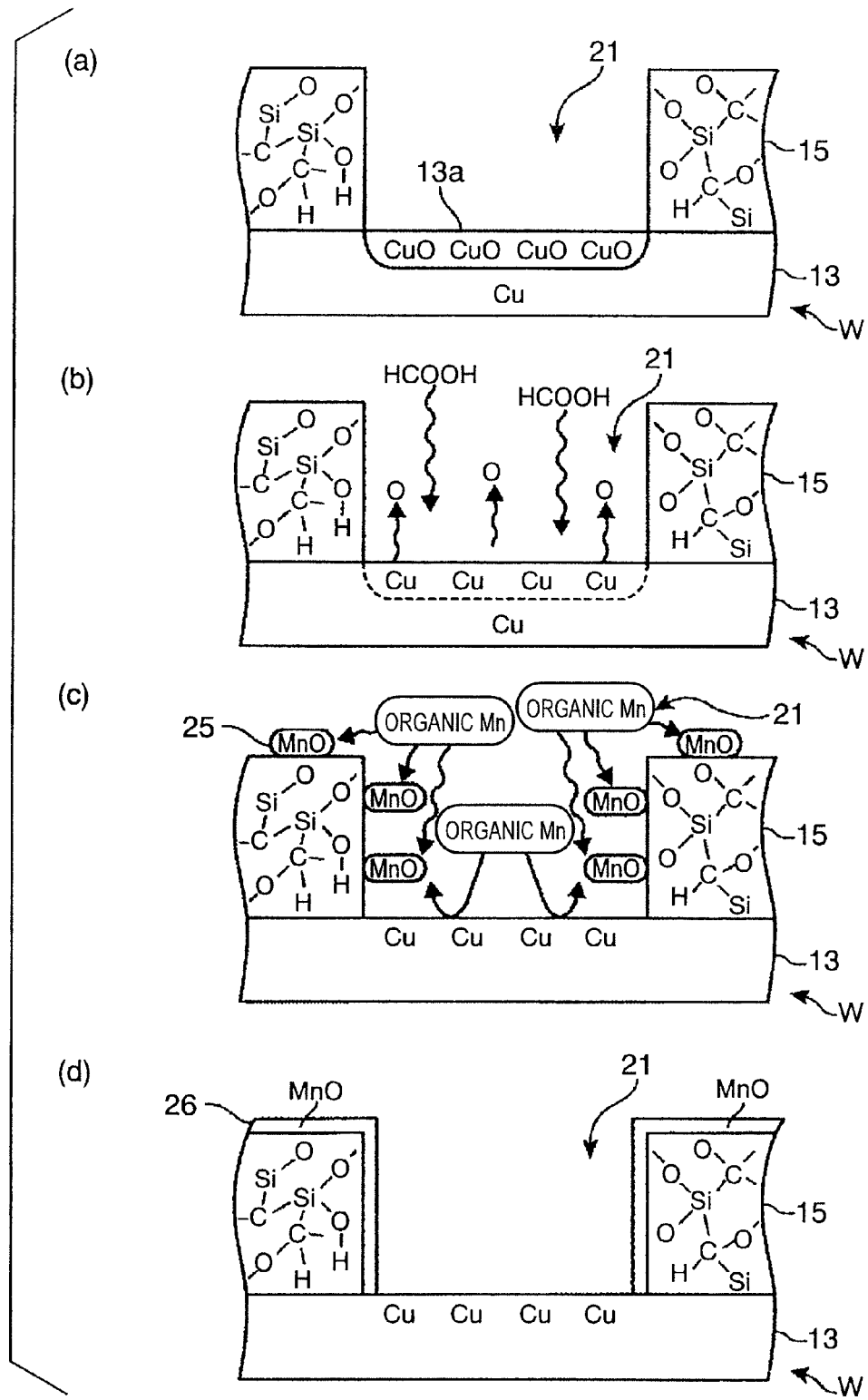
FIG. 2 is a schematic view showing the manufacturing method.

An embodiment of the method of manufacturing a semiconductor device of the present invention is described with reference to FIGS. 1 and 2 corresponding to DD (Dual Damascene) steps of VFTL (Via First Trench Last). A semiconductor wafer (hereinafter referred to as "wafer") W used in the manufacturing method of the present invention is described at first. As shown in FIG. 1(a), a silicon oxide film 11 containing, e.g., silicon and oxygen is formed as an interlayer insulation (dielectric) film in a lower wiring layer 10 of the wafer W. For example, a copper wiring 13 whose main component is copper that is a first metal is embedded in the silicon oxide film 11 via a barrier film 12. The reference number 17 depicts an etching stop film.

Formed above the wiring layer 10 is a silicon oxide film 15 containing oxide and silicon as an interlayer insulation film, via an etching stop film 14, which is an insulation film made of SiO or SiC and also serves as a Cu diffusion barrier film. The silicon oxide film 15 is formed by a plasma CVD method or a coating method, using TEOS (Tetra Ethoxy Silane otherwise known as Tetraethyl Orthosilicate) as a raw material. An etching stop film 24 as a hard mask, for example, is formed on an intermediate position of the silicon oxide film 15 in a film-thickness direction. When a groove 21a is formed by an etching process described below, the etching stop film 24 sets a depth position of the groove 21a at an upper end position of the etching stop film 24. Above the silicon oxide film 15, there is stacked a sacrifice film 16 formed of, e.g., an organic photoresist mask or an inorganic hard mask, in order that the below-described recess 21 is formed in the silicon oxide film 15. An upper wiring layer 20 is formed in the wafer W in a manner as described below.

Herein, the silicon oxide film 11 and the silicon oxide film 15 are used as the interlayer insulation films. However, not limited thereto, the interlayer insulation film may be a film made of a silicon compound containing silicon (Si) and oxygen (O) or carbon (C), for example. Namely, the interlayer insulation film may be one or more films selected from the group consisting of a SiO film ($SiO_2$ film and the like), a SiOF film (film containing silicon, oxygen and fluorine), a SiC film (film containing silicon and carbon), a SiOC film (film containing silicon, oxygen and carbon), a SiCOH film (film containing silicon, carbon, oxygen, and hydrogen), a SiCN film (film containing silicon, carbon and nitrogen), a porous silica film, a porous methylsilsesquioxane film, a poly-arylene film, and a SiLK (registered trademark) film, or a fluorocarbon film. Alternatively, the interlayer insulation film may be of a hybrid structure in which an inorganic film such as a SiOC film and an organic film such as a poly-arylene film are stacked. Regarding the structure of the material, either a dense film or a porous film having small pores may be used. A film, which is made of such a material having a reduced specific dielectric constant in order to improve a wiring function, is referred to as a Low-k film. A film having a further reduced specific dielectric constant is referred to as an Ultra Low-k: ULK film.

(Process of Wafer)

As shown in FIG. 1(b), by a dual damascene method, for example, using the sacrifice film 16, the recess 21 composed of the trench groove 21a and a via hole 21b is formed by an etching process. The etching process is performed by making plasma process gases such as a $CF_4$ gas and an $O_2$ gas in a known parallel plate plasma processing apparatus. Then, in the above plasma processing apparatus, for example, the sacrifice film 16 is removed by an ashing process that supplies a plasma of an $O_2$ gas or the like to the wafer W. At this time, the etching stop film 14 also serving as a Cu diffusion barrier film remaining on the bottom of the via hole is removed by an etching process, so that a surface of the copper wiring 13 of the lower wiring layer 10 is exposed.

Thereafter, in order to remove residues caused by the etching process and the ashing process and remaining in the recess 21, there is performed a dry cleaning process using a plasma of Ar (argon) gas, for example. Since residues similarly adhere to the side surface and the rear surface of the wafer W, a wet cleaning process is performed as follows. For example, the wafer W is unloaded from the semiconductor manufacturing apparatus for a dry process and transferred in an atmospheric air. Then, the wafer W is loaded into a semiconductor manufacturing apparatus for a wet process, which is separately prepared, and immersed in a HF solution (hydrofluoric acid). Due to the above steps, the exposed surface of the copper wiring 13 undergoes a damage in the etching step, a damage in the cleaning step, and a contact with oxygen in the atmospheric air during the transfer in the atmospheric air, whereby the exposed surface is oxidized to generate a copper oxide 13a.

As described above, a Low-k film or a ULK film is used as the interlayer insulation film. Since the interlayer insulation film is exposed to a plasma or a chemical liquid in the etching step, the ashing step, and the cleaning step, the interlayer insulation film is damaged (decomposed or degenerated). For example, when a SiOC film is exposed to an oxygen plasma, Si—$CH_3$ radicals in the film decompose to generate Si—OH radicals. Since the Si—OH radicals are highly moisture-absorptive, a k value is increased and/or a coverage of the barrier metal is impaired, whereby the Cu diffusion barrier function is deteriorated.

FIG. 2(a) is a view schematically showing the conditions of the copper oxide 13a and the recess 21 at this time. An aspect ratio of the actual recess 21 is about 2 to 5, for example. In FIG. 2(a), illustration of the above-described etching stop films 14 and 24 are omitted. Also in FIGS. 2(b) to 2(d), illustration of the etching stop films 14 and 24 are omitted.

The wafer W is again loaded into the semiconductor manufacturing apparatus for a dry process. Then, a steam of a reducing agent, such as carbon acid that is organic acid, such as formic acid (HCOOH), is supplied to the wafer W, so as to perform a process for reducing the copper oxide 13a. As shown in FIGS. 1(c) and 2(b), the reducing process exposes metal copper to the bottom surface of the recess 21, because of the reduction of the copper oxide 13a in accordance with the following reaction formula, or a chemical etching action of the formic acid.

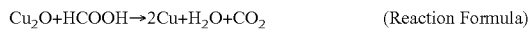

$Cu_2O + HCOOH \rightarrow 2Cu + H_2O + CO_2$  (Reaction Formula)

In the series of processes in the semiconductor manufacturing apparatus for a dry process, the wafer W is transferred under a vacuum atmosphere.

Then, the wafer W is heated at, e.g., 200° C. Simultaneously, together with a carrier gas such as a $H_2$ gas, a steam of an organic metal compound such as $(EtCp)_2Mn$ (bis-ethylcyclopentadienylmanganese) is supplied to the wafer W. The organic metal compound is a precursor containing a second metal, such as manganese (Mn), which is a metal for a self-forming barrier, but containing no oxygen. The organic metal compound will decompose upon contact with oxygen during the heating process. Since manganese is likely to strongly bond with oxygen and likely to bond with carbon, as shown in FIG. 2(c), the organic metal compound or the manganese reacts with oxygen or carbon as a part of ingredients contained in the silicon oxide film 15 and the etching stop films 14 and 24, or reacts with adsorbed moisture near the surfaces of the silicon oxide film 15 and the etching stop films 14 and 24, to thereby generate, e.g., manganese oxide (MnOx (x: given positive number)), or manganese carbide (MnCx (x: given positive number)), or manganese oxide carbide (MnCxOy (x, y: given positive numbers)) 25, which then adheres to the silicon oxide film 15 and the etching stop films 14 and 24. On the other hand, since the oxygen has been removed from the exposed surface of the copper wiring 13 by the above-described reducing process, the organic metal compound is unlikely to adhere to the surface of the copper wiring 13. Even when the organic metal compound adheres to the surface, the organic metal compound is difficult to decompose. Thus, the manganese in the metal state and the manganese oxide (or manganese carbide or manganese oxide carbide) 25 will not quickly adhere to the surface of the copper wiring 13, but the manganese oxide (or manganese carbide or manganese oxide carbide) 25 will selectively adhere only to the silicon oxide film 15 and the etching stop films 14 and 24 containing oxygen or carbon.

As described above, since the gaseous material is used, the material can uniformly diffuse in the vicinity of the wafer W. When this process is continuously performed for a predetermined period of time, e.g., about five minutes, the exposed surfaces of the silicon oxide film 15 and the etching stop films 14 and 24 are uniformly covered with the manganese oxide (or manganese carbide or manganese oxide carbide) 25, whereby a barrier film 26 as a self-forming barrier film is formed, as shown in FIGS. 1(d) and 2(d). The barrier film 26 is a film for restraining diffusion of metal such as copper from the below-described metal copper 27, which is to be embedded in the recess 21, into the silicon oxide film 15.

The manganese oxide (or manganese carbide or manganese oxide carbide) 25 has a very low reactivity (passivation feature), because it is in a passive state and it has a stability as a compound. Due to the passivation feature, the manganese-oxide deposition reaction is self-limited, whereby the film thickness of the manganese oxide 25 will not increase above a certain level. To describe in more detail, even when the aforementioned organic metal compound such as $(EtCp)_2Mn$ diffuses on the surface of the already deposited manganese oxide (or manganese carbide or manganese oxide carbide) 25, the organic metal compound does not nearly decompose. This is because, since the bond between the compounds of the manganese oxide manganese oxide (or manganese carbide or manganese oxide carbide) 25 is too strong to be separated, diffusion speeds of manganese, carbon and oxide are so low that supply of atoms is stopped, whereby the reaction is slow. In addition, when the thickness of the film reaches a certain level, the film blocks application of an electric field. Thus, the substances are reluctant to be ionized, which also retards the reaction. Further, since the manganese oxide (or manganese carbide or manganese oxide carbide) 25 has an amorphous structure and thus is free of grain boundary like a crystalline structure, the manganese oxide (or manganese carbide or manganese oxide carbide) 25 has almost no path through which atoms diffuse. This feature is also considered to retard the reaction and inhibit the increase of the film thickness. Thus, once the single barrier film 26 is formed, for example, the film thickness thereof is not increased any more. Thus, the barrier film 26 can have a very thin thickness of about, e.g., 2 to 5 nm.

As described above, because of the exposure to a plasma and a chemical liquid in the etching step, the ashing step, and the cleaning step, the interlayer insulation film (particularly the Low-k film and more particularly the ULK film) is often damaged (decomposed or degenerated). This process is effective in repairing the damage. For example, when a SiOC film is exposed to an oxygen plasma, Si—$CH_3$ radicals in the film decompose to generate Si—OH radicals. Since Mn is more likely to bond with O than C, Mn preferentially reacts with the Si—OH radical generated by the damage. Thus, since the Si—OH radicals are decreased, it can be prevented that a moisture absorbing property of the SiOC film is increased, that a k value is increased, and that a coverage of the barrier metal is impaired. Namely, it can be expected that deterioration of the Cu-diffusion barrier function can be avoided, Further, since the CVD reaction is process under a supply rate-determining condition rather than a reaction rate-determining condition, a step coverage of the barrier film 26 for the silicon oxide film 15 and the etching stop films 14 and 24 becomes significantly high. Even when the CVD reaction occurs under a reaction rate-determining condition, since the deposition reaction of the manganese oxide 25 is self-limited, uniformity of the film thickness of the formed barrier film 26 is improved, whereby an excellent step coverage can be obtained.

Then, after the organic metal compound of manganese is discharged, a steam of copper material, such as Cu(hfac) TMVS which is a beta-diketone copper complex, and a carrier gas such as a $H_2$ gas are supplied to the heated wafer W. The copper complex decomposes on the surface of the wafer W so as to become metal copper 27, which then deposits on the surface of the wafer W including the inside of the recess 21, as shown in FIG. 1(e). Thereafter, surplus copper metal and the barrier film 26 on the upper side are removed by CMP (Chemical Mechanical Polishing), so that the upper wiring layer 20 is formed.

After the deposition of the metal copper 27, a thermal (annealing) process may be performed according to need. It can be expected that, even when the thermal (annealing) process is performed, the annealing process may be performed at a lower temperature for a shorter period of time, as compared with the conventional annealing process. This is because the wafer W has been already heated by the CVD process, and it is not necessary to diffuse surplus manganese (Mn) by the annealing process, because only the minimum quantity of manganese (Mn) required for forming the barrier film is deposited.

When the thermal (annealing) process is performed, the wafer W on which the metal copper 27 is deposited is heated at a predetermined process temperature of, e.g., about 100 to 450° C., in a processing vessel filled with an atmosphere of an oxygen-containing gas of a predetermined concentration, for example. Thus, the barrier film 26 made of manganese oxide 25 can be reliably formed on the boundary between the silicon oxide film 15 and the metal copper 27 in a self-aligning manner. As described above, during the thermal (annealing) process, when oxygen or the like (oxygen supply means or the like is not shown) is supplied into the processing vessel, an oxygen partial pressure can be controlled at, e.g., about 10 ppb or below.

(Apparatus Structure)

A semiconductor manufacturing apparatus used in the above method of manufacturing a semiconductor device is described with reference to FIGS. 3 to 5.

Figure 3:
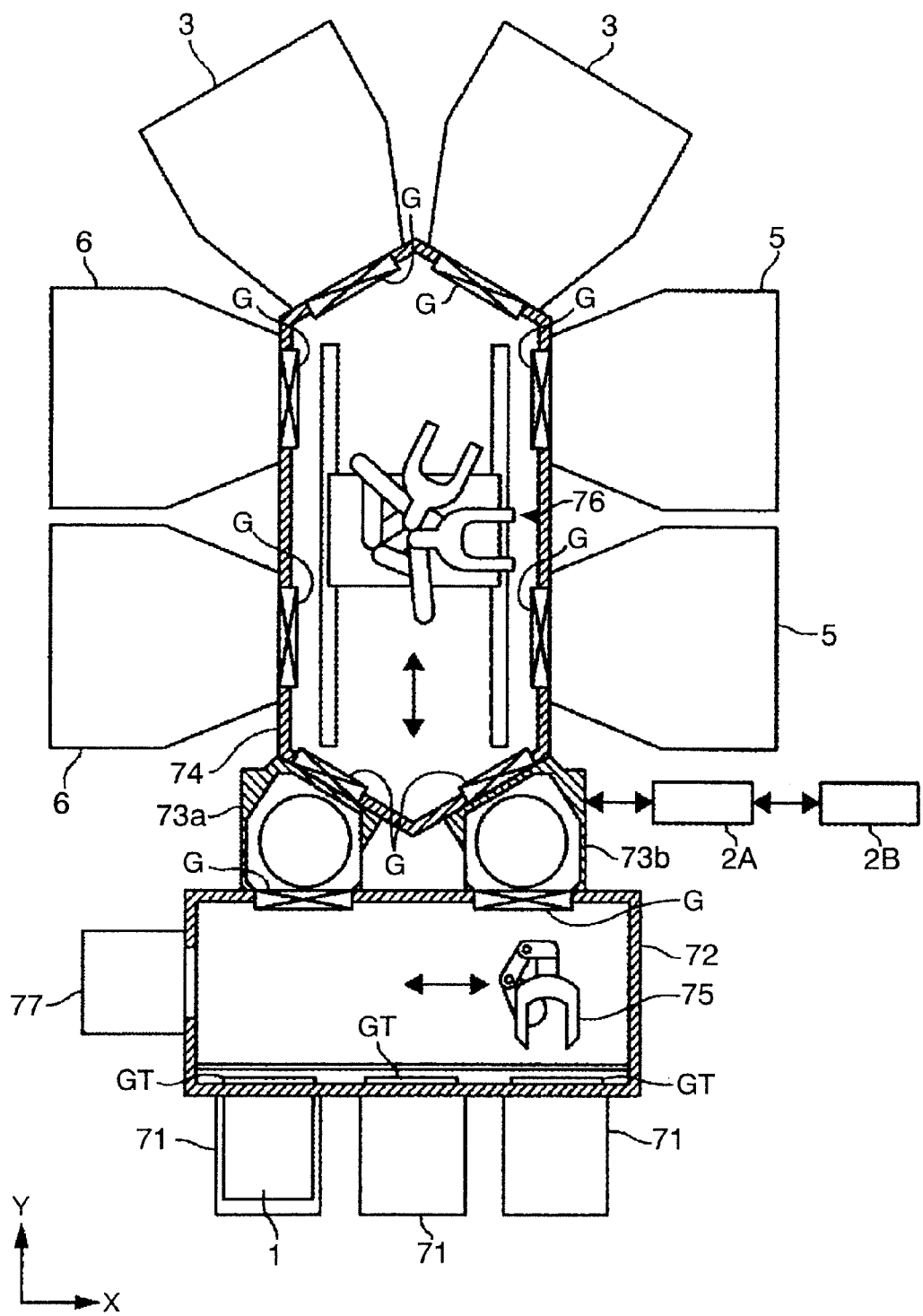
FIG. 3 is a plan view showing an example of a semiconductor manufacturing apparatus for carrying out the manufacturing method.

FIG. 3 is a semiconductor manufacturing apparatus called multi-chamber system, for example. A first transfer chamber 72 of an atmospheric atmosphere (airy atmosphere), load lock chambers 73a and 73b capable of switching a vacuum atmosphere and an atmospheric atmosphere, and a second transfer chamber 74 as a vacuum transfer chamber module, which are illustrated in FIG. 3 in this order from below, are air-tightly connected via gates G. The load lock chambers 73a and 73b are arranged in a right and left direction, for example, and a wafer W can wait there. In front of the first transfer chamber 72, there are disposed three load ports 71 in a lateral direction. A carrier 1 of a hermetically sealed type accommodating a plurality of wafers, e.g., twenty five wafers W can be placed on each load port 71. Formed in a front wall of the first transfer chamber 72 is a gate door GT to which the carrier 1 placed on the load port 71 is connected. The gate door GT is opened and closed together with a lid of the carrier 1. An alignment chamber 77 for adjusting orientation and eccentricity of the wafer W is connected to a side surface of the first transfer chamber 72.

Air-tightly connected to the second transfer chamber 74 are two formic-acid processing modules 3, two Cu—MnOxCVD modules 5, and two plasma processing apparatuses 6, which are described below. The inside of the transfer chamber 74 is filled with a vacuum atmosphere, for example, in order that the aforementioned copper wring 13 is not oxidized.

The first transfer chamber 72 and the second transfer chamber 74 are respectively provided with first transfer means (substrate transfer unit) 75 and second transfer means 76 as substrate transfer means (substrate transfer unit). The first transfer means 75 is a transfer arm that transfers the wafer W among the load port 71, the load lock chamber 73, and the alignment chamber 77. The first transfer means 75 is structured such that it can rotate about a vertical axis, move forward and rearward, and move in the arrangement direction of the load ports 71. The second transfer means 76 is a transfer arm that transfers the wafer W among the load lock chamber 73, the formic-acid processing modules 3, the Cu—MnOx-CVD modules 5, and the plasma processing apparatuses 6. The second transfer means 76 is structured such that it can rotate about the vertical axis, move forward and rearward, and move in the second transfer chamber 74 between a front side and a rear side when viewed from the side of the load ports 71.

Figure 4:
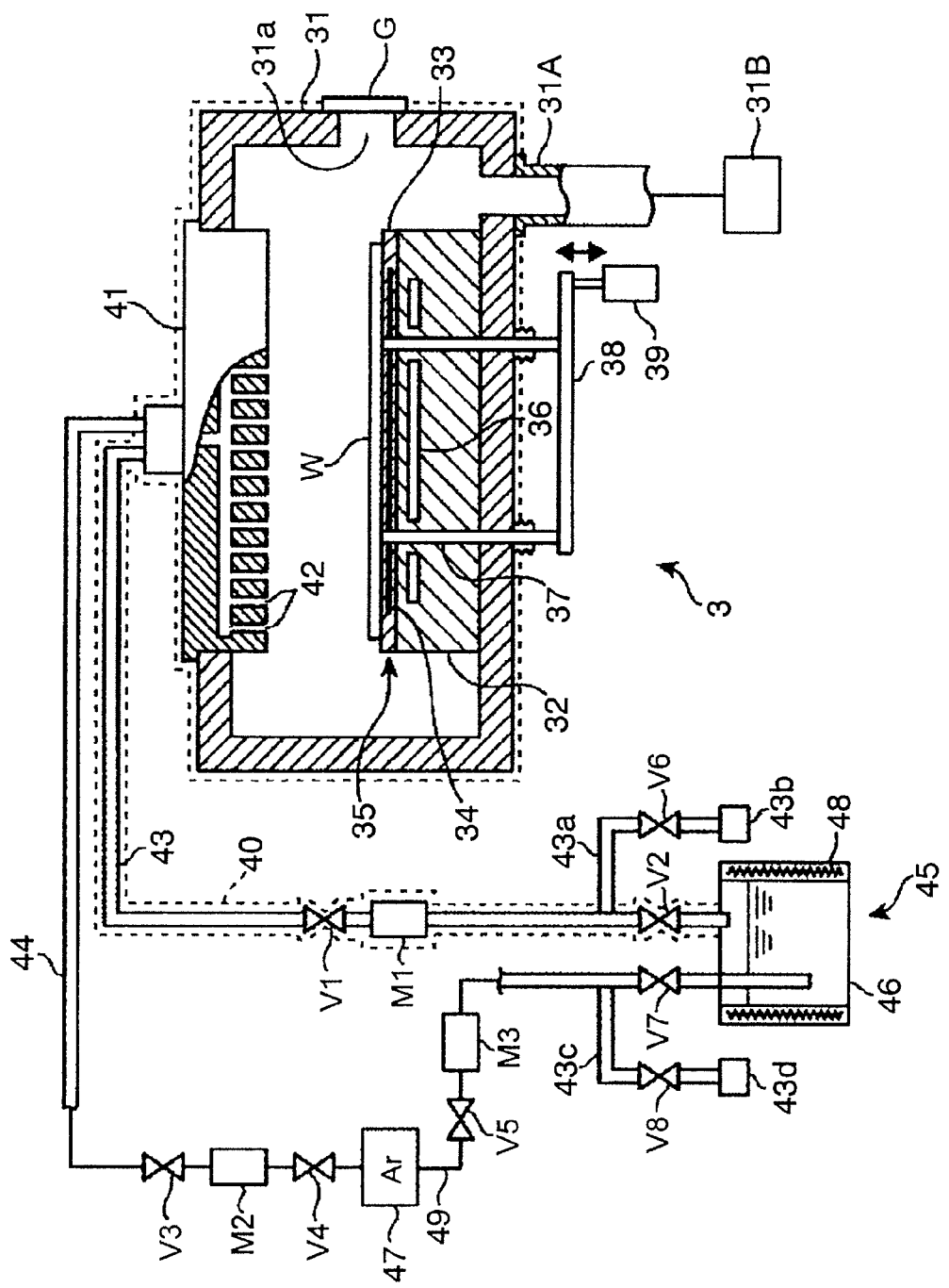
FIG. 4 is a longitudinal sectional side view showing an example of a formic-acid processing module included in the semiconductor manufacturing apparatus.

With reference to FIG. 4, the aforementioned formic-acid processing module 3 as a pre-processing module is described. In FIG. 4, the reference number 31 depicts a processing vessel defining a vacuum chamber made of, e.g., Al (aluminium), and the reference number 31a depicts a transfer port through which the wafer W is loaded and unloaded. A table 32 on which the wafer W can be placed is disposed on a bottom part of the processing vessel 31. In order to electrostatically suck the wafer W, Provided on the surface part of the table 32 is a an electrostatic chuck 35 having a dielectric layer 33 in which a chuck electrode 34 is embedded. A chuck voltage is applied to the chuck electrode 34 from a power supply part, not shown. In FIG. 4, the reference character G depicts a gate.

A heater 36 as heating means is disposed inside the table 32, so that the wafer W placed on the electrostatic chuck 35 can be heated at a predetermined temperature of, e.g., 200° C. The table 32 is provided with elevating pins 37 for transferring the wafer W to and from second transfer means 76, such that the elevating pins 37 can project from the surface of the table 32. The elevating pins 37 are joined to a drive part 39 through a support member 38 that is located below the processing vessel 31, whereby the elevating pins 37 are configured to be elevated and lowered by the drive part 39.

A gas showerhead 41 is disposed on an upper part of the processing vessel 31 so as to be opposed to the table 32. A number of gas supply holes 42 are formed in a lower surface of the gas showerhead 41. Connected to an upper surface of the gas showerhead 41 is one end of a first gas supply path 43 that supplies a steam of a reducing agent for reducing the aforementioned copper oxide 13a, such as carbon acid as organic acid, such as formic acid.

The other end of the first gas supply path 43 is connected to a reducing-agent supply source 45 serving as reducing means (reducing unit) or removing means (removing unit), via a valve V1, a mass flow controller M1 as a part for adjusting a gas flow rate, and a valve V2. Connected to a position between the valve V2 and the mass flow controller M1 is exhaust means (exhaust unit) 43b through a pipe 43a provided with a valve V6. The exhaust means 43b is configured to remove a gas (mainly atmospheric air) which enters the pipe (first gas supply path 43) when the reducing-agent supply source 45 is exchanged. The reducing-agent supply source 45 includes a stainless storage container 46 having a heater 48 arranged on an outside thereof. A reducing agent in a liquid state, for example, is stored in the storage container 46. Connected to the storage container 46 is a carrier-gas supply path 49 whose one end is opened at a position below a liquid surface of the reducing agent in the storage container 46. The other end of the carrier-gas supply path 49 is connected to a diluent-gas supply source 47 for supplying a diluent gas such as Ar (argon gas) via a valve V7, a mass flow controller M3, and a valve V5. Thus, the reducing agent in a liquid state is vaporized by the heater 48, so that the gaseous reducing agent, together with the diluent gas as a carrier gas, can be supplied to the gas showerhead 41.

Connected to a position between the mass flow controller M3 and the valve V7 is exhaust means (exhaust unit) 43d through a pipe 43a provided with a valve V8. The exhaust means 43d is configured to remove a gas (mainly atmospheric air) which enters the pipe (carrier-gas supply path 49) when the reducing-agent supply source 45 is exchanged. The aforementioned method for supplying formic acid is called bubbling method. However, since formic acid has a relatively high steam pressure, a gaseous reducing agent, which is obtained by heating the storage container 46 by the heater 48, may be supplied to the gas showerhead 41, with a flow rate thereof being directly controlled by the mass flow controller M1.

One end of the second gas supply path 44 is connected to the gas showerhead 41, and the other end of the second gas supply path 44 is connected to the aforementioned diluent-gas supply source 47 via a valve V3, a mass flow controller M2, and a valve V4. The aforementioned gaseous reducing agent and the diluent gas are mixed with each other in the gas showerhead 41, and the mixed gas is supplied from the gas supply holes 42 into the processing vessel 31. The processing vessel 31, the gas showerhead 41, the first gas supply path 43, the valve V1, the mass flow controller M1, and the valve V2, which are the parts with which formic acid comes into contact, are provided with a heater 40. Thus, when a wafer W is processed in the formic-acid processing module 3, these parts are heated such that the formic acid does not condense.

One end of an exhaust pipe 31A is connected to a bottom surface of the processing vessel 31, and a vacuum pump 31B which is vacuum exhaust means (vacuum exhaust unit) is connected to the other end of the exhaust pipe 31A. A pressure in the processing vessel 31 can be maintained at a predetermined pressure, by a not-shown pressure adjusting mechanism disposed on the exhaust pipe 31A.

Figure 5:
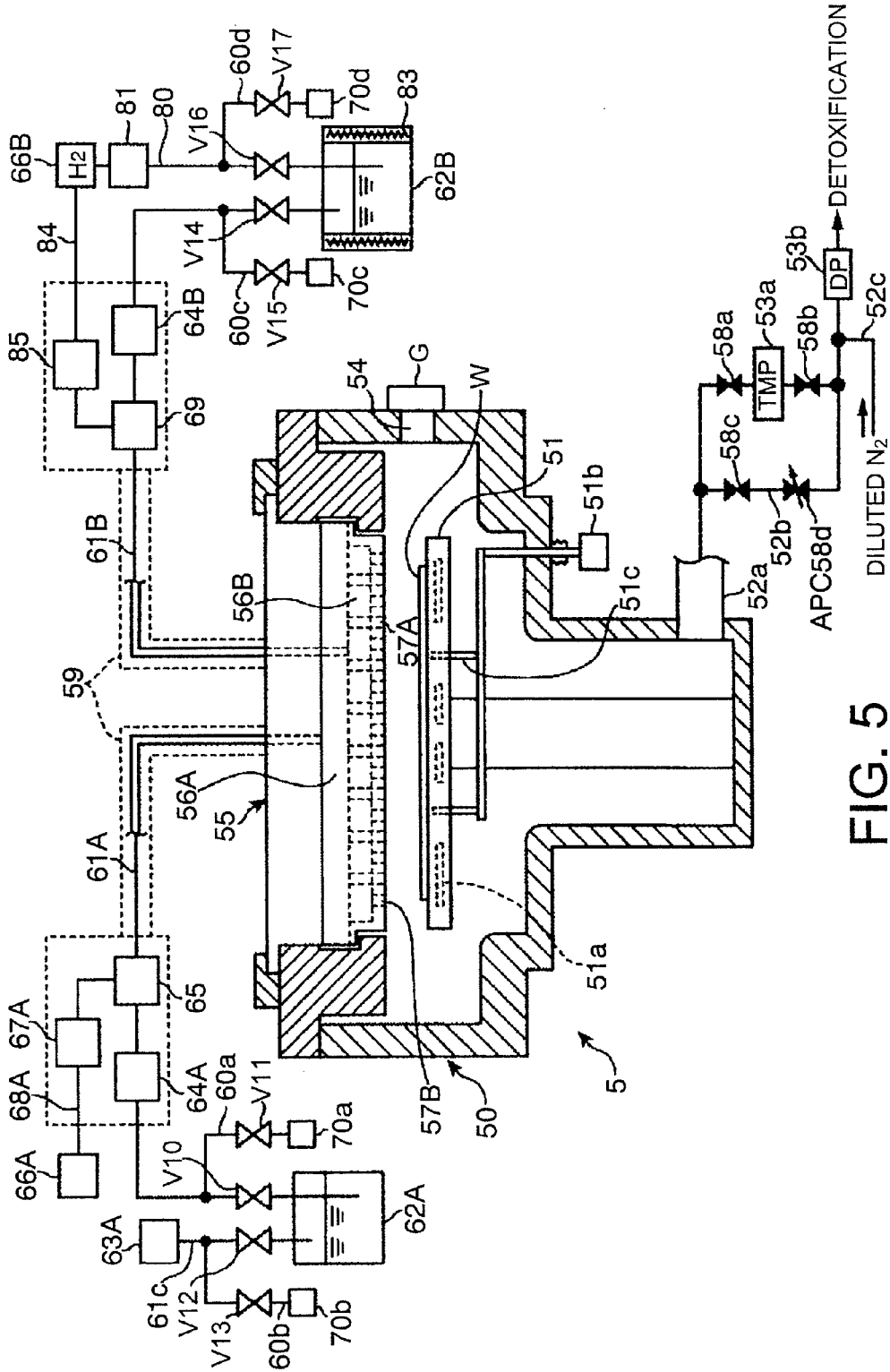
FIG. 5 is a longitudinal sectional side view showing an example of a Cu—MnOxCVD module included in the semiconductor manufacturing apparatus.

Next, with reference to FIG. 5, there is described the Cu—MnOxCVD module 5 that is a barrier-film forming module serving also as a first metal-wiring forming module. The Cu—MnOxCVD module 5 includes a processing vessel 50. A stage 51 on which a wafer W can be horizontally placed is disposed in the processing vessel 50. A heater 51a serving as heating means (heating unit) that heats the wafer W is disposed in the stage 51. In addition, the stage 51 is provided with hole parts, not shown, through which three elevating pins 51c (only two elevating pins 51c are illustrated as a matter of convenience) can pass. The elevating pins 51c can be elevated and lowered by an elevating mechanism 51b, so as to transfer the wafer W between the second transfer means 76 and the stage 51 via the elevating pins 51c.

One end of an exhaust pipe 52a is connected to a bottom part of the processing vessel 50, and connected to the other end of the exhaust pipe 52a is a vacuum pump (DP (Dry Pump)) 53b via a valve 58a, a TMP (Turbo Molecular Pump) 53a, and a valve 58b. A detoxifying apparatus, not shown, is connected to a downstream side of the vacuum pump 53b, so that an exhaust gas can be detoxified and discharged outside the system. One end of a bypass line 52b is connected to the exhaust pipe 52a at a position upstream the valve 58a, and the other end of the bypass line 52b is connected to the exhaust pipe 52b at a position between the valve 58b and the vacuum pump 53b via a valve 58c and an APC (Auto Pressure Controller) 58d.

Further, in order to prevent explosion of a process gas, such as hydrogen, flowing through the exhaust pipe 52a and the bypass line 52b, an inert-gas purge line 52c for supplying a diluent gas, such as nitrogen, is connected to the exhaust pipe 52a at a position between the bypass line 52b and the vacuum pump 53b. During when a film deposition process is performed, the process gas together with the diluent gas is discharged through the bypass line 52b, while the pressure in the processing vessel 50 is being controlled by the APC 58d, with the valve 58a being closed and the valve 58c being opened. Meanwhile, during when a film deposition process is not performed, the processing vessel 50 is exhausted through the TMP 53a, with the valves 58a and 58b being opened and the valve 58c being closed. By evacuating the processing vessel 50 with the use of the TMP 53a, the remaining gas in the processing vessel 50 can be reduced, whereby an excellent vacuum degree can be maintained. A transfer opening 54 that is opened and closed by a gage valve G is formed in a sidewall of the processing vessel 50.

A gas showerhead 55 is disposed on a ceiling part of the processing vessel 50 so as to be opposed to the stage 51. The gas showerhead 55 has gas chambers 56A and 56B which are divided from each other. Gases supplied to the gas chambers 56A and 56B are respectively supplied into the processing vessel 50 from gas supply holes 57A and 57B.

Connected to an upper surface of the gas showerhead 55 are one end of a copper-material supply path 61A for introducing a copper (Cu) material gas into the gas chamber 56A, and one end of a manganese-material supply path 61B for introducing a manganese (Mn) material gas into the gas chamber 56B. The copper-material supply path 61A and the manganese-material supply path 61B are provided with heaters 59, in order that the material steams flowing through the paths do not condense.

Connected to the other end of the copper-material supply path 61A is a copper-material storage part 62A as forming means (forming unit) that forms a first metal wiring, via a vaporizer 65 having, e.g., a heater for vaporizing a liquid copper material, a flow rate adjusting part 64A including a liquid mass flow controller and a valve, and a valve V10. Exhaust means (exhaust unit) 70a is connected to a position between the valve V10 and the flow rate adjusting part 64A through a pipe 60a provided with a valve V11. The exhaust means 70a is configured to remove a gas (mainly an atmospheric air) which enters the pipe (copper-material supply pipe 61A) when the copper-material storage part 62A is exchanged. The copper-material storage part 62A stores a copper organic metal compound as a copper material, such as Cu(hfac)TMVS which is a beta-diketone copper complex in a liquid state.

A pressurizing part 63A is connected to the copper-material storage part 62A through a gas supply pipe 61C provided with a valve V12. By pressurizing the inside of the copper-material storage part 62A by an inert gas, such as a He gas or an Ar gas, supplied from the pressurizing part 63A, the copper material in a liquid state can be extruded toward the vaporizer 65. Exhaust means 70b is connected to a position between the pressurizing part 63A and the valve V12 through a pipe 60b provided with a valve V13. The exhaust means 70b is configured to remove a gas (mainly an atmospheric air) which enters the pipe (gas supply pipe 61C) when the copper-material storage part 62A is exchanged.

Connected to the vaporizer 65 is a carrier-gas supply source 66A storing a carrier gas such as a H$_2$ gas, through a carrier-gas introduction pipe 68A provided with a flow rate adjusting part 67A. In the vaporizer 65, a carrier gas, for example, is heated, and the heated carrier gas is brought into contact with the aforementioned liquid copper material so as to vaporize the copper material. Thus, a steam of the copper material is supplied into the gas chamber 56A.

Connected to the other end (upstream side) of the manganese-material supply path 61B is a manganese-material storage part 62B, which is supplying means (supplying unit) that supplies a wafer W with a steam of an organic metal compound containing manganese but containing no oxygen, via a diluting part 69, a flow rate adjusting part 64B, and a valve V14, for example. The manganese-material storage part 62B stores an organic metal compound of manganese, such as (EtCp)$_2$Mn (bis-ethycyclopentadienylmanganese) in a liquid state. Exhaust means (exhaust unit) 70c is connected to a position between the valve V14 and the flow rate adjusting part 64B through a pipe 60c provided with a valve V15. The exhaust means 70c is configured to remove a gas (mainly an atmospheric air) which enters the pipe (manganese-material supply path 61B) when the manganese-material storage part 62B is exchanged. A heater 83 is disposed around the manganese-material storage part 62B, such that the material in the manganese-material storage part 62B can be heated at, e.g., 80° C.

Connected to the manganese-material storage part 62B is one end of a carrier-gas supply path 80 provided with, e.g., a heater, not shown, such that the one end is opened at a position below a liquid surface of the liquid material inside the manganese-material storage part 62B. Connected to the other end of the carrier-gas supply path 80 is a carrier-gas supply source 66B storing a carrier gas, such as a H$_2$ gas, via a valve V16 and a flow rate adjusting part 81. Thus, the manganese material heated and vaporized by the heater 83 together with the carrier gas can be supplied to the diluting part 69. Exhaust means 70d is connected to a position between the valve V16 and the flow rate adjusting part 81 though a pipe 60d provided with a valve V17. The exhaust means 70d is configured to remove a gas (mainly an atmospheric gas) which enters the pipe (carrier-gas supply path 80) when the manganese-material storage part 62B is exchanged.

One end of a diluent gas path 84 provided with a heater, not shown, is connected to the diluting part 69. Connected to the other end of the diluent gas path 84 is the aforementioned carrier-gas supply source 66B via a flow rate adjusting part 85. The diluting part 69 is configured to dilute the material gas to a predetermined concentration, and to supply the diluted material to the gas chamber 56B.

Figure 6:
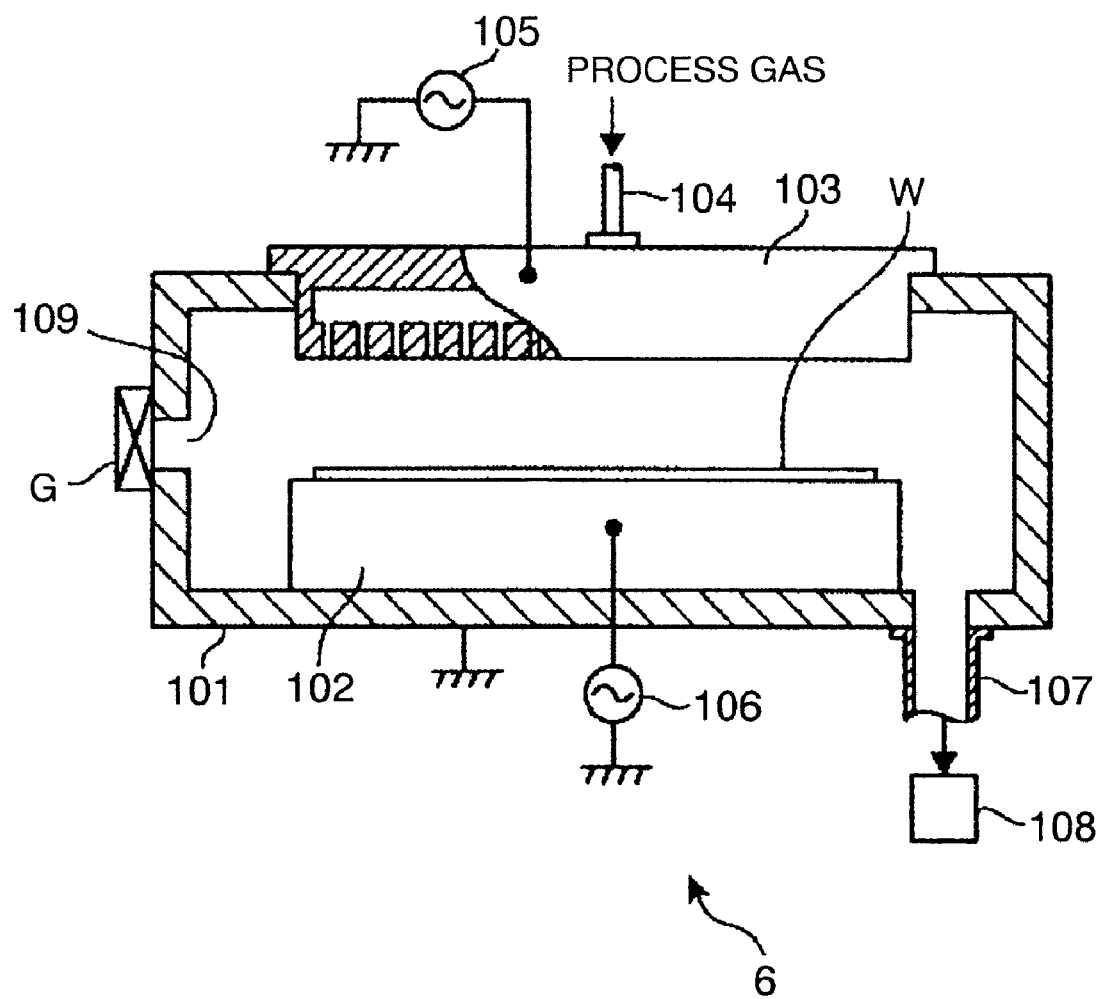
FIG. 6 is a longitudinal sectional side view showing an example of a plasma processing apparatus included in the semiconductor manufacturing apparatus.

As described above, the plasma processing apparatus 6 is a parallel plate processing apparatus. As schematically shown in FIG. 6, a wafer W is placed on a table 102 serving also as a lower electrode in a processing vessel 101. Then, a process gas is supplied into the processing vessel 101 through a process-gas supply path 104 from a gas showerhead 103 which also serves as an upper electrode and is disposed so as to be opposed to the table 102. In addition, a radiofrequency for generating plasma is supplied from an upper power source 105, and a biasing radiofrequency for drawing ions to the wafer W is supplied from a lower power source 106. Thus, the wafer W is subjected to a plasma process by a plasma made of the process gas converted in a plasma state. In FIG. 6, the reference number 107 depicts an exhaust pipe, 108 depicts a vacuum pump, 109 depicts a transfer opening, and G depicts a gate.

As shown in FIG. 3 described above, the semiconductor manufacturing apparatus is equipped with a control part 2A formed of, e.g., a computer. The control part 2A has a data processing part including a program, a memory, and a CPU. The program includes commands (respective steps) by which a control signal is sent from the control part 2A to the respective parts of the semiconductor manufacturing apparatus so as to perform the aforementioned respective steps. In addition, the memory has an area in which values of process parameters, such as a process pressure, a process temperature, a process period, a gas flow rate, and an electric power value, are written. When the CPU executes the respective commands of the program, these process parameters are read out, and control signals corresponding to the parameter values are sent to the respective parts of the semiconductor manufacturing apparatus. This program (including a program relating to an operation for inputting the process parameters and a display thereof) is stored in a storage part 2B formed of a computer storage medium, such as a flexible disc, a compact disc, a hard disc, or an MO (magnetoptical disc), and is installed on the control part 2A.

(Flow of Wafer)

A wafer W is firstly subjected to a plasma process in advance, by the aforementioned plasma processing apparatus 6 to form a recess 21 by an etching process and an ashing process. Thereafter, the wafer W is subjected to a wet cleaning process, for example. Then, the carrier 1 accommodating the wafer W is transferred by the transfer means, not shown, to the semiconductor manufacturing apparatus, and the carrier 1 is placed on the load port 71. After that, the wafer W accommodated in the carrier 1 is transferred to the alignment chamber 77 via the first transfer chamber 72. After the orientation and the eccentricity of the wafer W have been adjusted, the wafer W is transferred to the load lock chamber 73. The pressure in the load lock chamber 73 is adjusted, and then the wafer W is loaded into the formic-acid processing module 3 via the second transfer chamber 74.

Then, the wafer W is placed on the table 32, the inside of the processing vessel 31 is vacuumized to a predetermined vacuum degree of, e.g., abut 100 to 500 Pa (0.75 to 3.75 Torr), and the wafer W is heated to a predetermined temperature of, e.g., about 150 to 300° C. Then, a gaseous reducing agent such as formic acid (and a carrier gas) are supplied into the gas showerhead 41, with flow rates thereof being 10 to 100 sccm and 0 to 100 sccm, respectively. In addition, a diluent gas is supplied into the gas showerhead 41 at a predetermined flow rate of, e.g., 0 to 200 sccm. Thus, the gaseous formic acid and the diluent gas are mixed therein, and the mixed gas is supplied to the wafer W. Thereafter, as described above, the copper oxide 13a is reduced or etched by the formic acid. After the reducing process has been performed for a predetermined period of time, e.g., for about 1 to 10 minutes, the supply of the reducing agent, the carrier gas, and the diluent gas is stopped. Then, the processing vessel 31 is vacuumized, and the wafer W is unloaded to the second transfer chamber 74.

Following thereto, the wafer W is transferred to the Cu—MnOxCVD module 5, and is placed on the stage 51 in the processing vessel 50. Then, the wafer W is heated at a temperature of, e.g., about 100 to 500° C., more specifically, 200° C. After that, the flow rate of the carrier gas (and the diluent gas) is adjusted to a predetermined flow rate of, e.g., about 10 to 100 sccm, more specifically 25 sccm (about 0 to 100 sccm), such that a flow rate of the organic metal compound of manganese becomes a predetermined flow rate, e.g., about 2 to 10 sccm, more specifically, about 7 sccm. These gases are mixed in the diluting part 69, and the mixed gas is supplied to the wafer W for a predetermined period of time, e.g., 5 minutes or more. Thus, the aforementioned barrier film 26 is formed. Alternatively, the wafer W may not be heated, by adjusting a film deposition condition such as a film deposition period, such that the barrier film 26 is formed. Thereafter, the supply of the mixed gas is stopped, and the processing vessel 50 is vacuumized. Then, a gaseous copper material is supplied to the wafer W at a predetermined flow rate, so that the metal copper 27 is deposited on the surface of the wafer W including the recess 21. Thereafter, the supply of the gas is stopped, and the processing vessel 50 is vacuumized. Then, the wafer W is unloaded to the carrier 1 via the second transfer chamber 74, the load lock chamber 73, and the first transfer chamber 72.

According to the above embodiment, for example, after the recess 21 has been formed by the etching process, the copper oxide 13a on the surface of the copper wiring 13, which has been oxidized by the etching process and the cleaning process, is reduced or etched by means of formic acid, so that the oxygen on the surface of the copper wiring 13 is removed. Then, by supplying the surface of the wafer W with the organic metal compound of manganese containing no oxygen, which is highly reactive with oxygen, generation of the manganese oxide 25 is allowed on the silicon oxide film 15 and the etching stop films 14 and 24, which contain oxygen, while generation of the manganese oxide 25 is not allowed on the surface of the copper wiring 13 containing no oxygen. Thus, the barrier film 26 can be selectively formed on the silicon oxide film 15 and the etching stop films 14 and 24, with the copper being exposed to the surface of the copper wiring 13.

After the barrier film 26 has been formed, the copper material is supplied to the wafer W, so that the metal copper 27 is deposited on the surface of the wafer W including the recess 27. The series of processes are performed under a vacuum atmosphere. Thus, there is no insulation object, such as the manganese oxide 25 and a natural oxide film of copper, between the copper wiring 13 and the metal copper 27. Thus, increase of a wiring resistance can be restrained.

Further, on the surface of the barrier film 26, i.e., inside the metal copper 27, there is contained no or a little, if any, surplus manganese. Thus, increase of a wiring resistance can be restrained. Furthermore, since an annealing process for discharging the manganese can be omitted, a throughput can be improved.

Alternatively, after the metal copper 27 has been deposited, a thermal (annealing) process may be performed according to need. It can be expected that, even when the thermal (annealing) process is performed, the annealing process may be performed at a lower temperature for a shorter period of time, as compared with the conventional annealing process. This is because the wafer W has been already heated in the CVD process, and it is not necessary to diffuse surplus manganese (Mn) by the annealing process, because only the minimum quantity of manganese (Mn) required for forming the barrier film is deposited.

Figure 7:
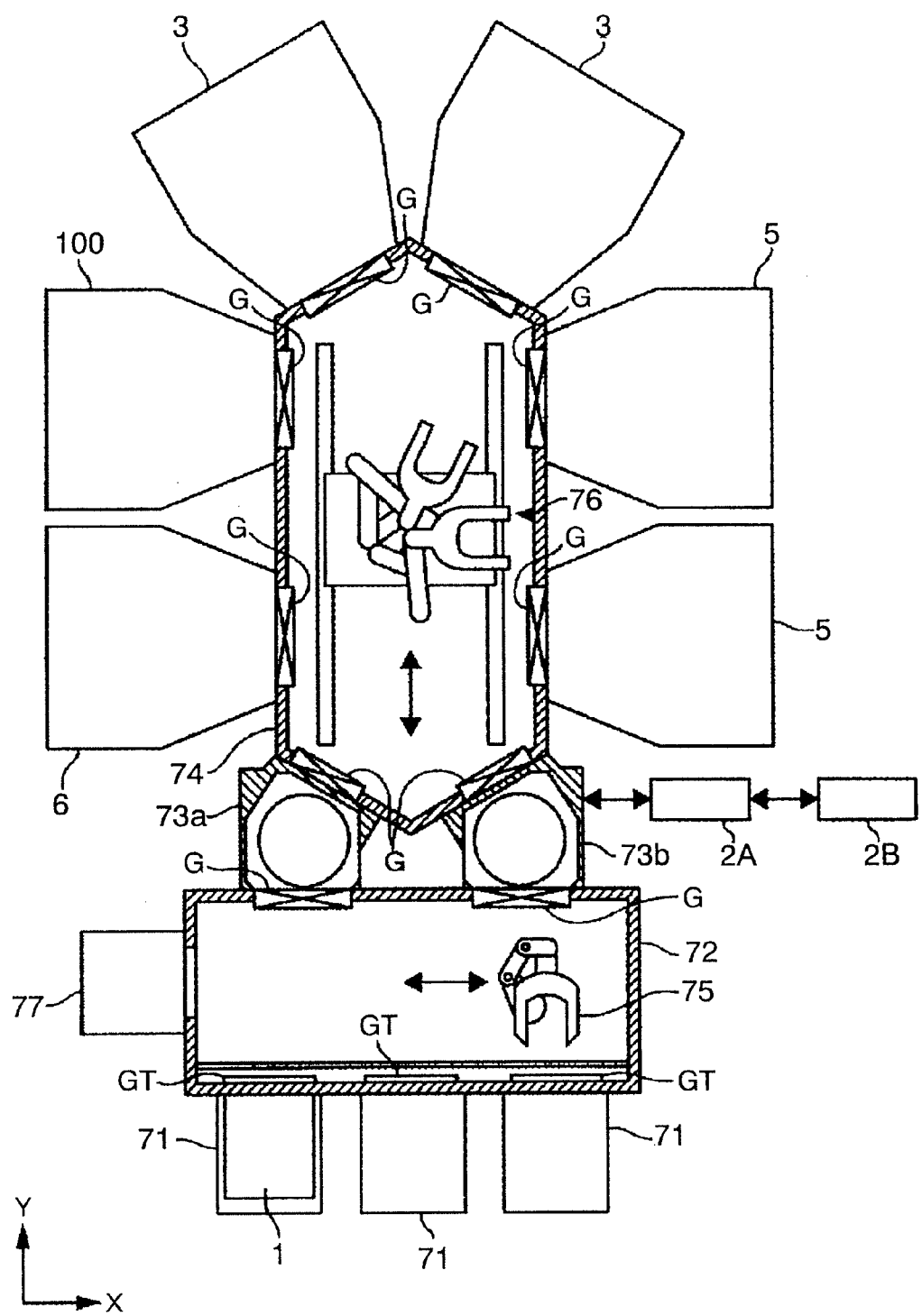
FIG. 7 is a plan view showing an example in which an annealing unit is applied to the semiconductor manufacturing apparatus.

When the thermal (annealing) process is performed, an annealing unit 100 may be air-tightly connected to the aforementioned second transfer chamber 74 (FIG. 7). The annealing unit 100 includes: a processing vessel in which a table for placing thereon a wafer W is disposed; heating means (heating unit) for heating the wafer W; and means for maintaining the inside of the processing vessel under an oxygen-containing gas atmosphere, such as a gas supply path; although they are not shown. In this case, the wafer W on which the metal copper 27 is deposited is heated at a predetermined process temperature of, e.g., about 100 to 450° C., under an atmosphere of an oxygen-containing gas of a predetermined concentration, for example. Thus, the barrier film 26 made of manganese oxide 25 can be reliably formed on the boundary between the silicon oxide film 15 and the metal copper 27, in a self-aligning manner. As described above, during the thermal (annealing) process, when oxygen or the like (oxygen supply means or the like is not shown) is supplied into the processing vessel, an oxygen partial pressure can be controlled at, e.g., about 10 ppb or below.

Since the barrier film 26 is formed in the above manner, even a film thickness thereof is very thin, a significantly excellent barrier function against copper can be provided, which will be described in the following examples. Thus, in a subsequent device manufacturing step, even when the barrier film 26 is subjected to a thermal process about 400° C., for example, diffusion of copper into the silicon oxide film 15 can be restrained, whereby increase of a leak current can be restrained. In addition, another reason for the significantly excellent barrier function provided by such a thin barrier film 26 is considered that, since the barrier film 26 is formed at a low temperature of, e.g., 500° C. or below, the barrier film 26 becomes amorphous, and there is no grain boundary of the manganese oxide 25, whereby diffusion paths for copper are closed.

In addition, the film deposition process of the barrier film 26 on the oxide (film containing oxygen) is performed for a predetermined period that is longer than an incubation period (incubation period is a period starting from a timing when a material gas is supplied to the wafer W to a timing when a reactant starts to deposit on the wafer W), for example, for 1 minute or more in a case where a film deposition temperature is 200° C. In this case, on the surfaces of the silicon oxide film 15 and the etching stop films 14 and 24, the organic metal compound of manganese having adhered to the surfaces tends to induce a reaction by which the organic metal compound of manganese decomposes and adheres thereto as the manganese oxide 25. On the other hand, on the surface of the copper wiring 13 (film containing no oxygen), the organic metal compound of manganese having adhering to the surface does not reach such a reaction. Thus, the organic metal compound of manganese will not decompose and adhere to the surface as the manganese oxide 25. Therefore, as described above, the barrier film 26 can be selectively formed. However, suppose that the film deposition process of the barrier film 26 is performed over a predetermined period that is longer than the incubation period on the metal, for example, for 60 minutes or more in a case where a film deposition temperature is at 200° C., for example. In this case, on both the oxide and the metal, the organic metal compound of manganese having adhering thereto reacts such that the organic metal compound decomposes and adheres thereto as the manganese oxide 25. Thus, the selective deposition of the barrier film 26 cannot be achieved.

A film thickness of such a barrier film 26 is preferably, 1 nm to 7 nm, more preferably 1.5 nm to 4 nm, and most preferably 2 nm to 3 nm. The aforementioned JP2007-67107A describes that a film thickness of the deposited manganese (Mn) is 2 nm. However, when a metal manganese film is oxidized to become a manganese oxide film, a film thickness thereof is increased about 2.7 times. Thus, when the manganese film of 2 nm is oxidized to become a manganese oxide film, the manganese oxide film as a barrier film has a film thickness of 5.5 nm.

As described above, since the barrier film 26 is formed by the CVD method using a gaseous material, even when an opening size of the recess 21 is narrow, a step coverage can be enhanced, as well as the barrier film 26 can be uniformly formed. Even when the wafer W has a pattern in which the recesses 21 of different opening sizes are formed, such a barrier film 26 can be formed. Thus, in a copper multilayer wiring, the barrier film 26 can be applied both a local wiring and a global wiring. Moreover, since the copper multilayer wiring can be miniaturized, a working speed of a device can be improved. Simultaneously, a chip size can be reduced, the number of device chips (such as logics and memories) obtained from one wafer W can be increased, to thereby decrease a cost required for the device.

Further, since a working speed of the device is improved, a calculating speed or an information processing speed of an electronic instrument (e.g., an electronic calculator, a telecommunication equipment, an information terminal, and a mobile phone) including the device can be accelerated. Furthermore, since the above barrier film 26 can restrain diffusion of copper of the metal wiring, a leak current of the interlayer insulation film can be restrained. Since a reliability of the wiring can be improved, a life time of the electronic instrument including the device can be elongated. Still furthermore, since a required calculation can be performed by a smaller circuit, the device can be used in an information terminal such as a mobile phone which is desired to be made smaller.

Furthermore, the barrier film 26 is not formed by firstly depositing metal manganese and then oxidizing the same, but the barrier film 26 made of manganese oxide is directly formed. Thus, the barrier film 26 can be selectively grown depending on the presence and absence of oxygen. In addition, immediately after the formation of the barrier film 26, the barrier film 26 can exhibit the barrier function against copper. Thus, although a film thickness of the barrier film 26 is thin, the significantly excellent barrier function can be obtained. As described in the below examples, the barrier film 26 may contain C (carbon) in addition to oxygen.

As a material used for forming the barrier film 26, an organic metal compound containing no oxygen is preferred, which preferably contains annular carbon hydride. In addition, as described above, the compound is preferably capable of being decomposed by the presence of oxygen. As such a material, $Cp_2Mn$ (bis-cyclopentadienyl manganese), $(MeCp)_2Mn$ (bis-methyl cyclopentadienyl manganese), or $(i-PrCp)_2Mn$ (bis-isopropyl cyclopentadienyl manganese) may be used, or a combination of these materials may be used. Further, even when the compound contains oxygen, as long as the oxygen is CO that does not independently react with manganese after decomposition of the compound, $(MeCp)Mn(CO)_3$ (tri-carbonyl methyl cyclopentadienyl manganese) may be used, for example. As a carrier gas, a reducing gas or an inert gas such as an Ar gas may be used, in addition to $H_2$.

As a reducing agent used for a reducing process, an organic acid such as acetic acid or hydrogen may be used, in addition to formic acid. In addition, the copper oxide 13a may be physically removed by a sputtering method using an argon gas.

In addition, in the above example, after the barrier film has been formed, the metal copper 27 is separately deposited. Thus, these processes may be respectively performed in separate processing vessels 50. In addition, in order to bring the barrier film 26 and the metal copper 27 into contact with each other more strongly, for example, supply of a copper material may be started simultaneously with the formation of the barrier film 26. Then, by increasing the supply amount of the copper material little by little, there is formed a contact layer in which a ratio of copper relative to the amount of manganese is gradually increased, as a given point comes closer to the surface layer. In this case, since an interface between the barrier film 26 and the metal copper 27 becomes complicated and vague, a contact (adhesion) between the barrier film 26 and the metal copper 27 is enhanced. In this case, in order to decrease an amount of surplus manganese contained in the metal copper 27, it is preferable that a supply amount of the copper material is increased, while a supply amount of manganese is gradually decreased. The state of the aforementioned contact layer is considered to be one of a CuMn alloy, or Cu+MnOx (x: given positive number) mixture, or Cu+MnCx (x: given positive number) mixture, or Cu+MnCxOy (x, y: given positive number) mixture, or CuMnxOx (x, y: given positive number) mixture, or CuMnxCy (x, y: given positive number) compound, or CuMnxCyOz (x, y, z: given positive number) compound, or a mixture of them.

After the barrier film 26 has been formed, a copper seed layer may be formed by, e.g., a sputtering method, and the aforementioned metal copper 27 may be embedded in the recess 21. In this case, for example, a seed-layer forming module as a processing vessel for sputtering is air-tightly connected the second transfer chamber 74. The seed layer is formed by seed-layer forming means (seed-layer forming unit) disposed in the processing vessel. The seed-layer forming means is structured such that metal atoms, which are sputtered by colliding argon ions created by, e.g., a DC magnetron method with a metal source for sputtering (sputtering target) disposed in the processing vessel, can be deposited on a substrate. According to the sputtering method, an excellent contact can be expected by an anchoring effect in which the sputtered metal atoms are anchored in the barrier film 26. As the sputtering method, there may be used a DC (direct current) double pole sputtering method, a RF (radiofrequency) sputtering method, a plasma sputtering method, a magnetron sputtering method, and an ion beam sputtering method. In order to improve the step coverage, there may be used a collimation sputtering method, a distance sputtering method, and an ionizing sputtering method. In this case, while a film is being formed by sputtering, the wafer W may be heated or cooled at 0° C. or below, for example. At this time, the wafer W is transferred under vacuum, in order that the surface of the copper wiring 13 and the seed layer are not oxidized.

In the above example, although the metal copper 27 is formed by the CVD method, the metal copper 27 may be formed by a PVD method such as a sputtering method, an electrolytic plating method, or an electroless plating method. Also in this case, after the formation of the barrier film 26, a metal film such as copper, which serves as a seed layer, may be formed in the recess 21 by the CVD method or the sputtering method. As a method for forming the barrier film 27 and the metal copper 27, there may be used a plasma CVD method and an optical CVD method, in addition to the thermal CVD method, for example. In addition, the barrier film 26 may be formed by an ALD (Atomic Layer Deposition) method. Further, in the above example, although the barrier film 26 and the metal copper 27 are deposited in the same processing vessel 50, the respective film deposition processes may be performed in the separate processing vessels 50.

The aforementioned metal copper 27 may be made of, in addition to pure copper, a metal containing copper as a main component, Al, Ag, or the metal copper 27 may contain plural kinds of these metals. In addition, there is described that the aforementioned copper oxide 13a is generated by the etching process. However, in a case where the copper oxide 13a is generated during a transfer under atmospheric air, for example, the method of manufacturing a semiconductor device of the present invention can be applied. When the copper oxide 13a is not generated, the aforementioned reducing process may not be performed. On the other hand, even when the copper oxide 13a is generated, it is not necessary to completely remove the copper oxide 13a but it is sufficient to reduce the copper oxide 13a, as long as the manganese oxide 25 can be selectively generated on the sidewall of the recess 21. In addition, the barrier film 26, which is formed by supplying an organic metal compound of manganese onto the silicon oxide film 15 containing oxygen, is explained herein as the manganese oxide 25 made of MnOx (x: given positive number). However, in the academic conference, there exists another theory that the barrier film 26 is made of MnSixOy (x, y: given positive number) because the barrier film 26 brings therein silicon in the silicon oxide film 15. Thus, the expression "manganese oxide 25" intends to include MnOx (x: given positive number) and MnSixOy (x, y: given positive number).

Herein, there is described the example in which the silicon oxide film 15 is used as an interlayer insulation film as a base film. However, not limited thereto, the aforementioned Low-k film and the ULK film such as an organic film and a porous film may be used.

In addition, manganese (Mn) is used herein as the second metal, which is by way of example. Not limited thereto, another metal, such as one or more metals selected from the group consisting of Mg, Al, Ti, V, Cr, Ni, Ge, Y, Zr, Nb, Tc, Rh, Pd, Sn, Re, and Pt, may be used. Thus, as the aforementioned organic compound, there may be used one or more compounds selected from the group consisting of $Cp_2$Metal [Metal$(C_5H_5)_2$], (MeCp)$_2$Metal[=Metal$(CH_3C_5H_4)_2$], (Me$_5$Cp)$_2$Metal[=Metal $((CH_3)_5C_5H_4)_2$], (EtCp)$_2$Metal[=Metal $(C_2H_5C_5H_4)_2$], (i-PrCp)$_2$Metal [=Metal$(C_3H_7C_5H_4)_2$], (t-BuCp)$_2$Metal [=Metal $(C_4H_9C_5H_4)_2$], Metal(DMPD)(EtCp) [=Metal$(C_7H_{11}C_2H_5C_5H_4)$] (herein "Metal" means the aforementioned second metal element).

In addition, the above-described film deposition apparatus is only an example. For example, as means for heating a substrate, a heating lamp such as a halogen lamp may be used in place of a resistance heater. Moreover, the thermal processing apparatus may be either of a single wafer-fed type or of a batch type.

Further, a semiconductor wafer is taken by way of example as an object to be processed. However, not limited thereto, the present invention may be applied to a glass substrate, an LCD substrate, a ceramic substrate, and an organic substrate made of plastic, for example.

EXAMPLES

Herebelow, the experiments conducted for the present invention are described. In the experiments, a dummy wafer W shown in FIG. 8(a) was used. The wafer W was manufactured as follows. At first, a silicon oxide film 91 of 100 nm in thickness was formed on a silicon substrate 90 by a plasma CVD method, at 350° C., using TEOS (Tetra Ethoxy Silane, otherwise Tetraethyl Orthosilicate). Then, a manganese oxide layer 92 was formed on the silicon oxide film 91 in the aforementioned Cu—MnOxCVD module, under film deposition conditions as described below. Then, a copper film 93 was formed on the surface of the wafer W by the sputtering method, such that the copper film 93 has a thickness of 100 nm. Thereafter, the wafer W was subjected to a thermal process under the following annealing conditions in order to confirm whether copper diffused or not. Then, the below-described experiment was conducted for the wafer W. Note that, since this experiment did not require an excellent step coverage, a substrate free of pattern was used. For this reason, the copper film 93 was formed by the sputtering method, not by the CVD method. However, also by the sputtering method, properties other than a film quality and a step coverage were practically trouble-free.

The film deposition period for forming the manganese oxide layer 92 was set as long as 30 minutes. This is because, as described above, the base selectivity of the manganese oxide layer 92 in the CVD film deposition is more clearly demonstrated, by using the different incubation periods depending on the bases. That is to say, the following phenomenon was found by an experiment having conducted in advance. Namely, when an organic metal compound of manganese is supplied to a film containing oxygen at a film deposition temperature of, e.g., 200° C., after 1 minute has elapsed, the organic metal compound of manganese adhering to the film decomposes and starts to adhere thereto as manganese oxide. Thus, the film deposition was set as described above. It was already confirmed that, even when the organic metal compound of manganese is supplied to copper for such a long period of time, a continuous manganese oxide film will not be formed on the copper surface.

The thermal process under the annealing conditions was conducted for testing a heating acceleration for verifying a Cu diffusion barrier function, and thus was not conducted under an oxygen atmosphere. Namely, the above thermal process differs from a conventional thermal process that is conducted under an oxygen atmosphere in order for self-forming a barrier film and diffusing and discharging surplus manganese.

(Film Deposition Conditions)
Precursor (material): (EtCp)$_2$Mn
Set Temperature of Heater 83: 70° C.
Carrier Gas: $H_2$, 25 sccm
Film Deposition Temperature: 300, 400, 500° C.
Process Pressure: 133 Pa (1 Torr)
Film Deposition Period: 30 minutes
(Annealing Conditions)
Supply Gas: Ar 50 sccm
Heating Temperature for Wafer W: 400° C.
Pressure upon Annealing: 667 Pa (5 Torr)
Annealing Period: 20 minutes (for raising temperature)+40 minutes (for maintaining temperature)

Experiment 1

Observation of Section

Figure 9:
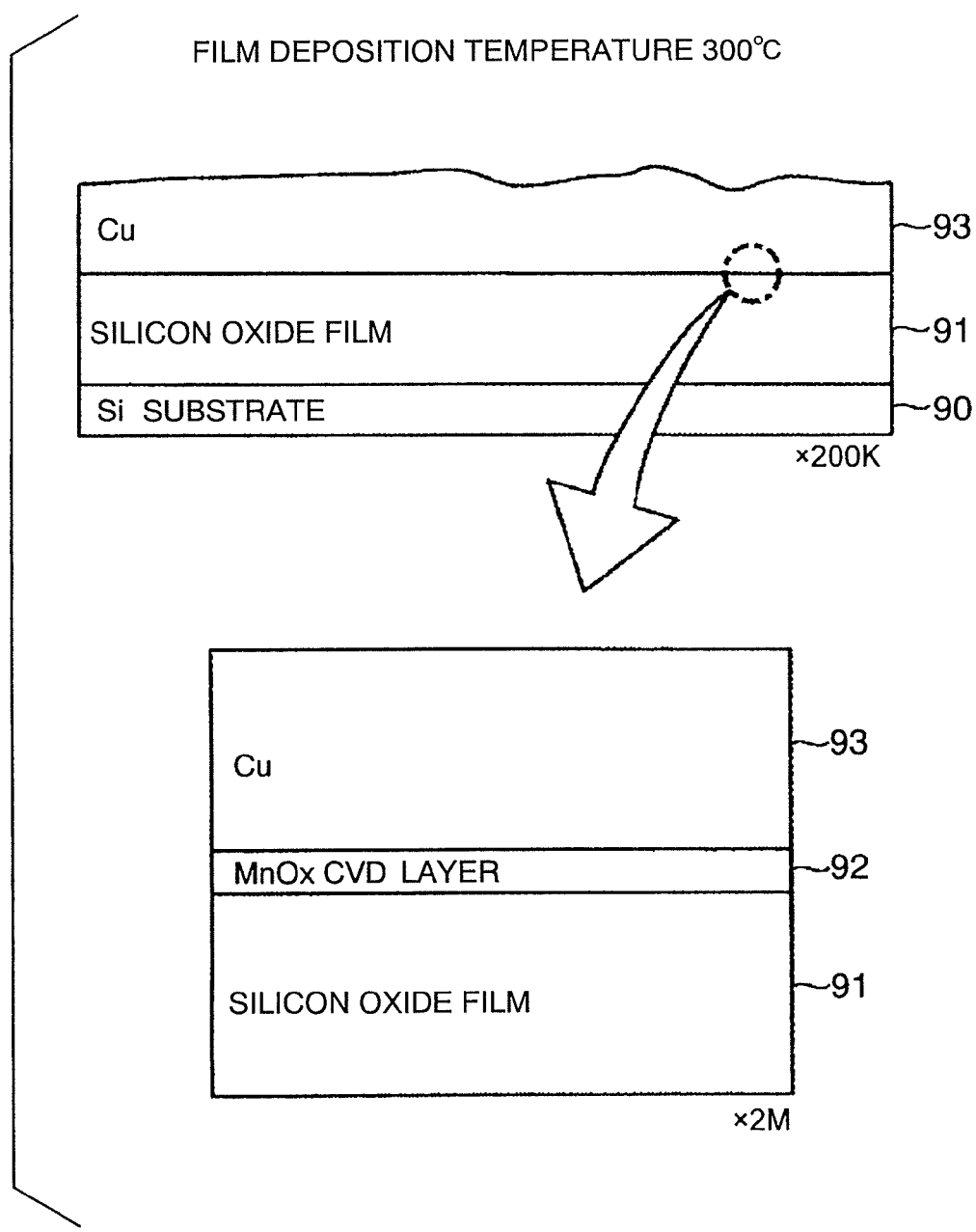
FIG. 9 is a characteristic view schematically showing a result obtained in the example.
Figure 11:
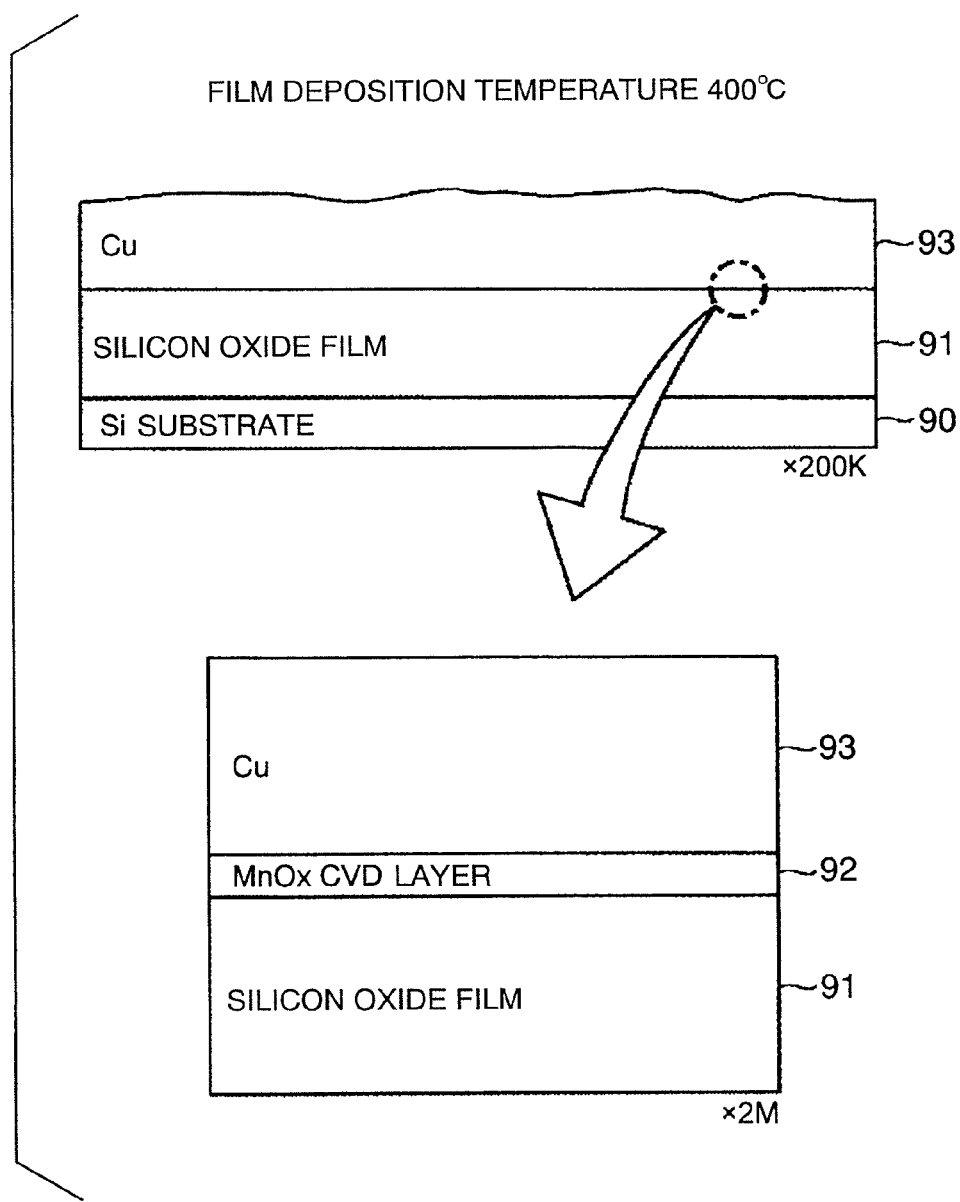
FIG. 11 is a characteristic view schematically showing a result obtained in the example.

The cut surfaces of the above three kinds of wafers W were observed by using a TEM (Transmission Electron Microscopy). As shown in FIGS. 9 and 11, in the wafers W on which the films had been deposited at 300° C. and 400° C., there was confirmed a very thin manganese oxide layer 92 as small as 5 nm in thickness between the silicon oxide film 91 and the copper film 93. This film was a smooth continuous film whose interfaces were free of irregularities, and was amorphous without any crack such as a grain boundary. There was found no surplus manganese that remained and/or segregated between the silicon oxide film 91 and the copper film 93. Although not shown, in the wafers W on which the films had been deposited at 100° C. and 200° C., the same experiment result was confirmed. A film thickness of the manganese oxide film 92 obtained herein was further small, i.e., 2 to 3 nm.

Figure 10:
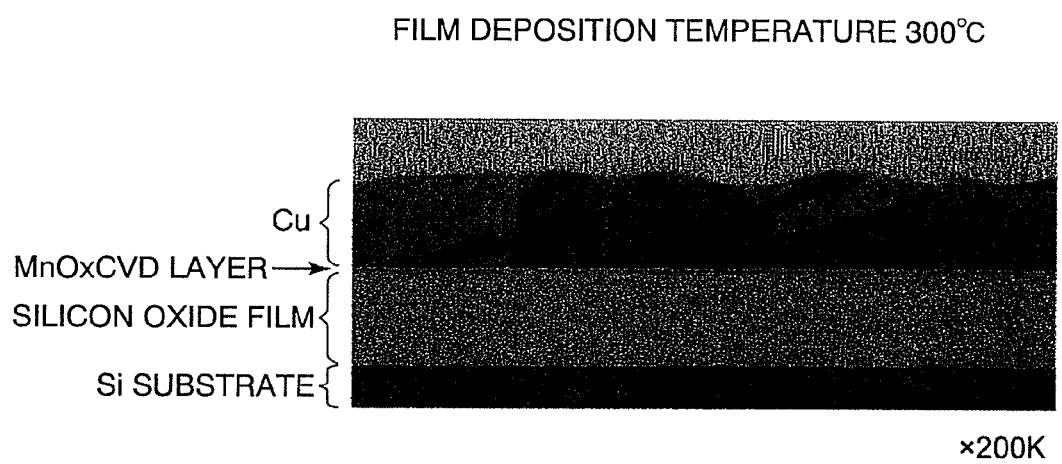
FIG. 10 is a characteristic view showing an actually picturized TEM image of the schematically shown characteristic view.
Figure 12:
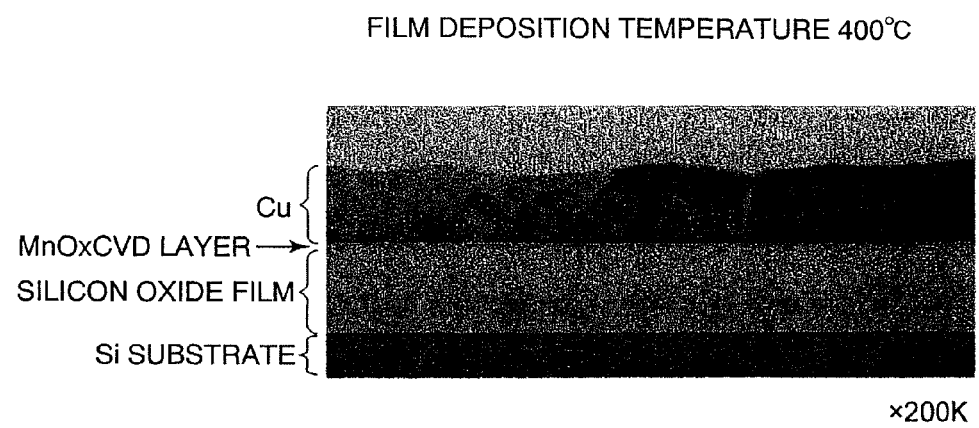
FIG. 12 is a characteristic view showing an actually picturized TEM image of the schematically shown characteristic view.

Thus, due to the formation of the aforementioned barrier film 26 by such a method, it can be understood that an annealing process for discharging surplus manganese, i.e., an annealing process under an oxygen atmosphere is unnecessary. The above FIGS. 9 and 11 are diagrammatic views schematically showing the TEM images actually picturized, in order to discriminate boundaries between the respective areas. FIGS. 10 and 12 are views showing the actually picturized TEM images which are schematically shown in FIGS. 9 and 11.

In the wafer W on which the films had been deposited at 500° C., some island-like grain growths were confirmed. In addition, between the silicon oxide film 91 and the copper film 93, there were stacked a relatively highly crystalline layer, a layer considered to contain a large amount of carbon, and an amorphous layer, in this order from above. The amorphous layer is considered to correspond to the very thin manganese oxide layer 92 formed between the silicon oxide film 91 and the copper film 93, which was observed in the wafers W on which the films had been deposited at 300° C. and 400° C. However, since the island-like grain growth, i.e., an abnormal grain growth occurs when the film deposition temperature is increased, it can be understood that the film deposition temperature of the manganese oxide layer 92 is preferably less than 500° C. As described above, it was already confirmed that, by an experiment additionally conducted, the manganese oxide layer 92 can be deposited at 100° C. and 200° C.

Experiment 2

Composition Mapping in Section

Next, compositions of the sections of the respective wafers W were analyzed by using an EDX (Energy Dispersive X-ray Analysis). In each wafer W, an adhesive was applied to the surface of the copper film 93 for the analysis.

Figure 13:
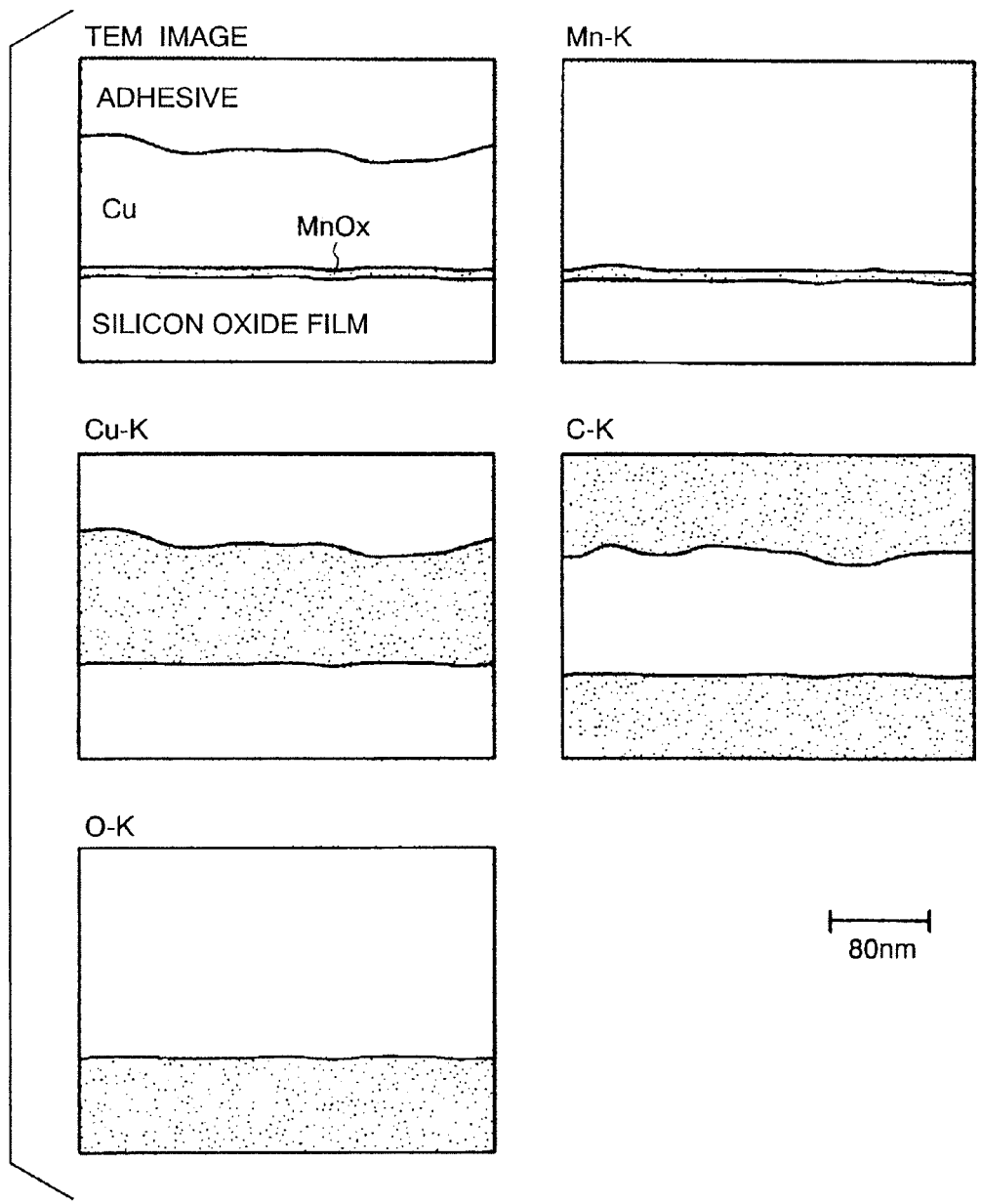
FIG. 13 is a characteristic view showing a result obtained in the example.
Figure 14:
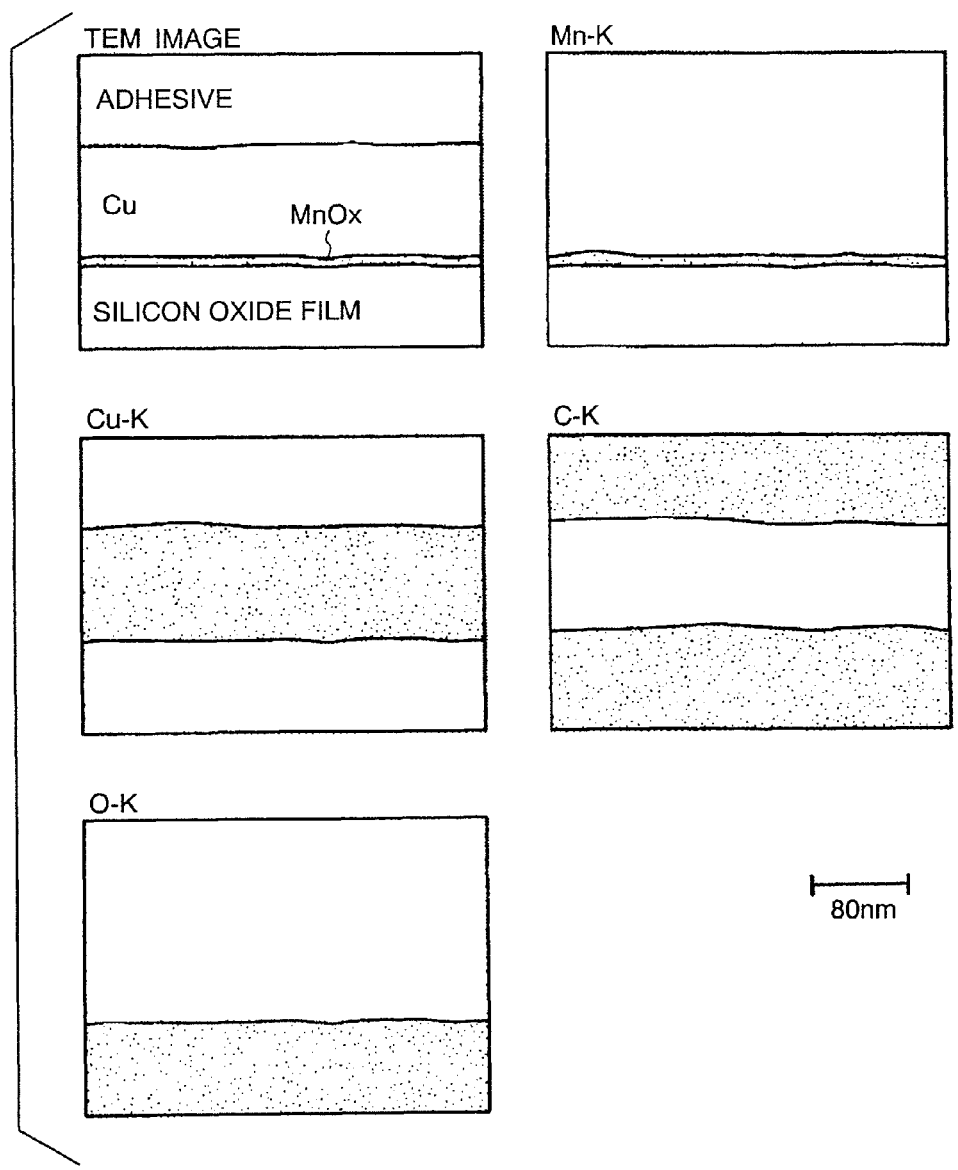
FIG. 14 is a characteristic view showing a result obtained in the example.

As shown in FIGS. 13 and 14, in the wafers W on which the films had been deposited at 300° C. and 400° C., a manganese signal was confirmed only in the very thin layer 92 formed between the silicon oxide film 91 and the copper film 93. Thus, manganese is unquestionably contained in the very thin layer 92, and the manganese is considered to be manganese oxide, considering the below-described result obtained by means of a SIMS. On the other hand, since no Cu signal is detected from the silicon oxide film 91, it did not seem that Cu permeated into the silicon oxide film 91.

From above, it was found that the manganese oxide layer 92 had a significantly excellent Cu-diffusion barrier function, and that there existed no pin hole (for example, Cu diffusion path such as crystalline interface) through which Cu permeated. Although not shown, in the wafers W on which the films had been deposited at 100° C. and 200° C., the same experiment result was confirmed. Similarly to FIGS. 9 and 11, FIGS. 13 and 14 are diagrammatic views schematically showing the actually picturized images.

On the other hand, in the wafer W on which the films had been deposited at 500° C., it was found that the aforementioned island-like grain growth portion contained a large amount of manganese, i.e., an abnormal grain growth occurred. Thus, it was reconfirmed that the phenomenon observed in Experiment 1 was caused by the abnormal grain growth of manganese.

Experiment 3

Element Analysis in Film Thickness Direction

Figure 15:
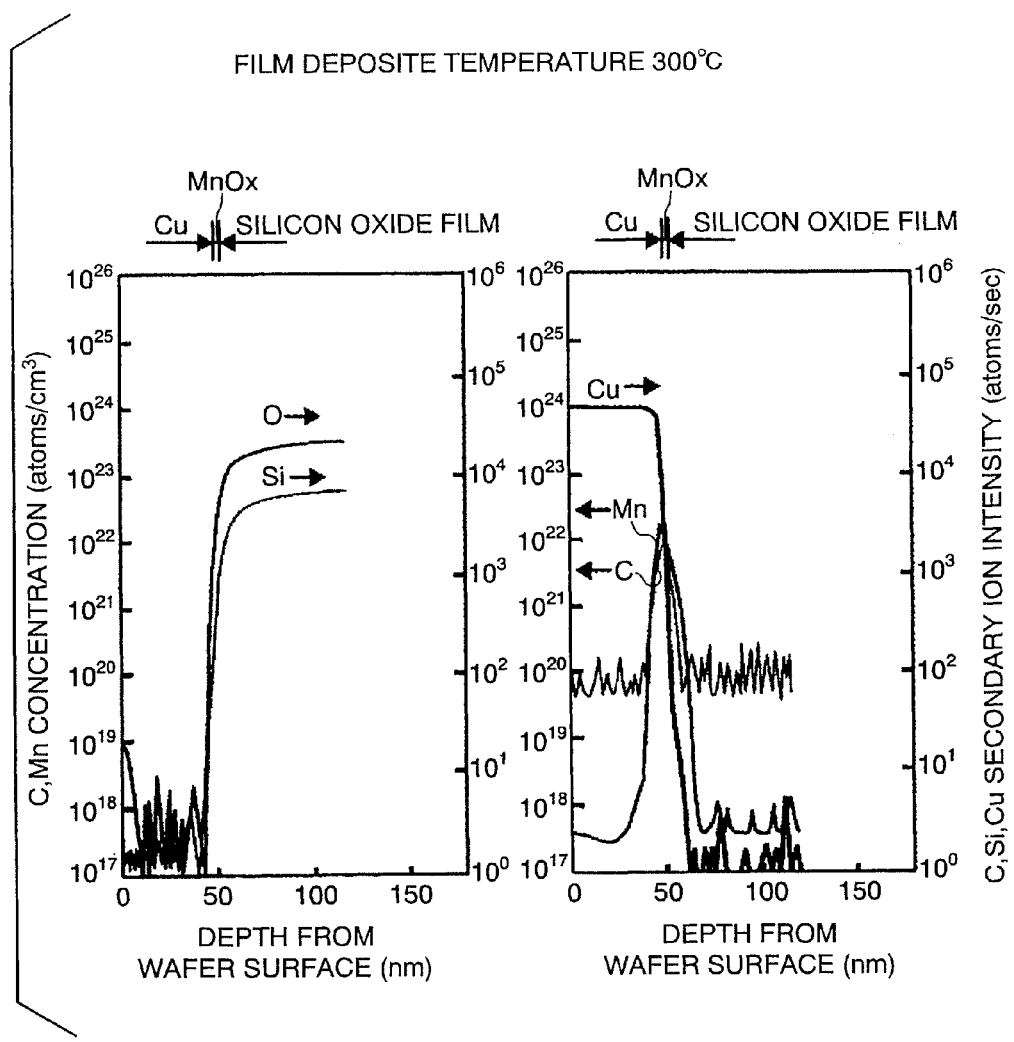
FIG. 15 is a characteristic view showing a result obtained in the example.
Figure 16:
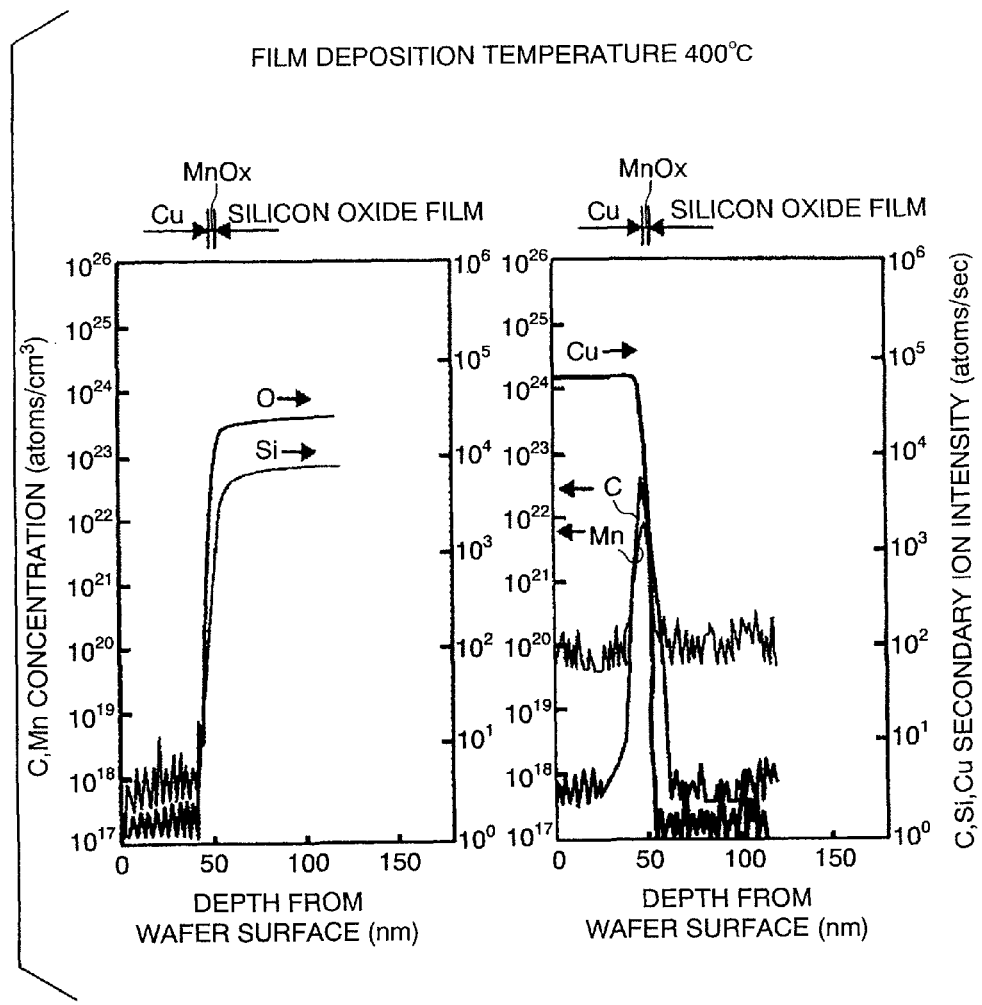
FIG. 16 is a characteristic view showing a result obtained in the example.

While the above respective wafers W were being etched in the film thickness direction, an element analysis in a depth direction was conducted by using a SIMS (Secondary Ion Mass Spectrometry). In this measurement, the wafer W was etched from the side of the rear surface of the silicon substrate. This is because, if the film is etched from the side of the front surface (side of the Cu film in FIGS. 15 and 16), Cu atoms of the upper layer may enter the manganese oxide layer 92 and the silicon oxide layer 91 during an analysis of components thereof. As shown in FIGS. 15 and 16, in the wafers W on which the films had been deposited at 300° C. and 400° C., a copper peak in the manganese oxide layer 92 was drastically decreased as a measuring point moved upward from downward, and almost no peak was found in an upper end of the silicon oxide film 91 (lower end of the manganese oxide layer 92) (since the peak value detected herein was a signal near the detection limitation and was thus a noise level, the presence of Cu in the silicon oxide film 91 can be regarded as substantially zero).

From above, although the manganese oxide layer 92 is such a thin film, it can be understood that the manganese oxide layer 92 has a significantly excellent barrier function. Although not shown, in the wafers W on which the films had been deposited at 100° C., 200° C., and 500° C., the same experiment result was confirmed.

In addition, correspondingly to the result of Experiment 2, the peak of the manganese is very sharp. Since a peak of the carbon overlapping with the peak of the manganese was confirmed, it was confirmed that the carbon contained in the organic metal compound of manganese was taken in by the manganese atoms. Thus, an effect of scavenging impurities by the manganese atoms can be expected. Accordingly, it can be expected that, when a film is deposited by the CVD method using a similar organic metal compound of, e.g., Cu precursor (material), impurities such as carbon and fluorine contained in the organic metal compound of Cu react with manganese so as to be taken into the manganese oxide layer 92, whereby the impurities in the copper film 93 can be reduced. Alternatively, it can be expected that, when a Cu film is deposited by means of an electrolytic plating method or an electroless plating method, impurities such as chlorine derived from a plating liquid react with manganese so as to be taken into the manganese oxide layer 92, whereby the impurities in the copper film 93 can be reduced.

Experiment 4

Observation of Step Coverage in Small Holes

Figure 8:
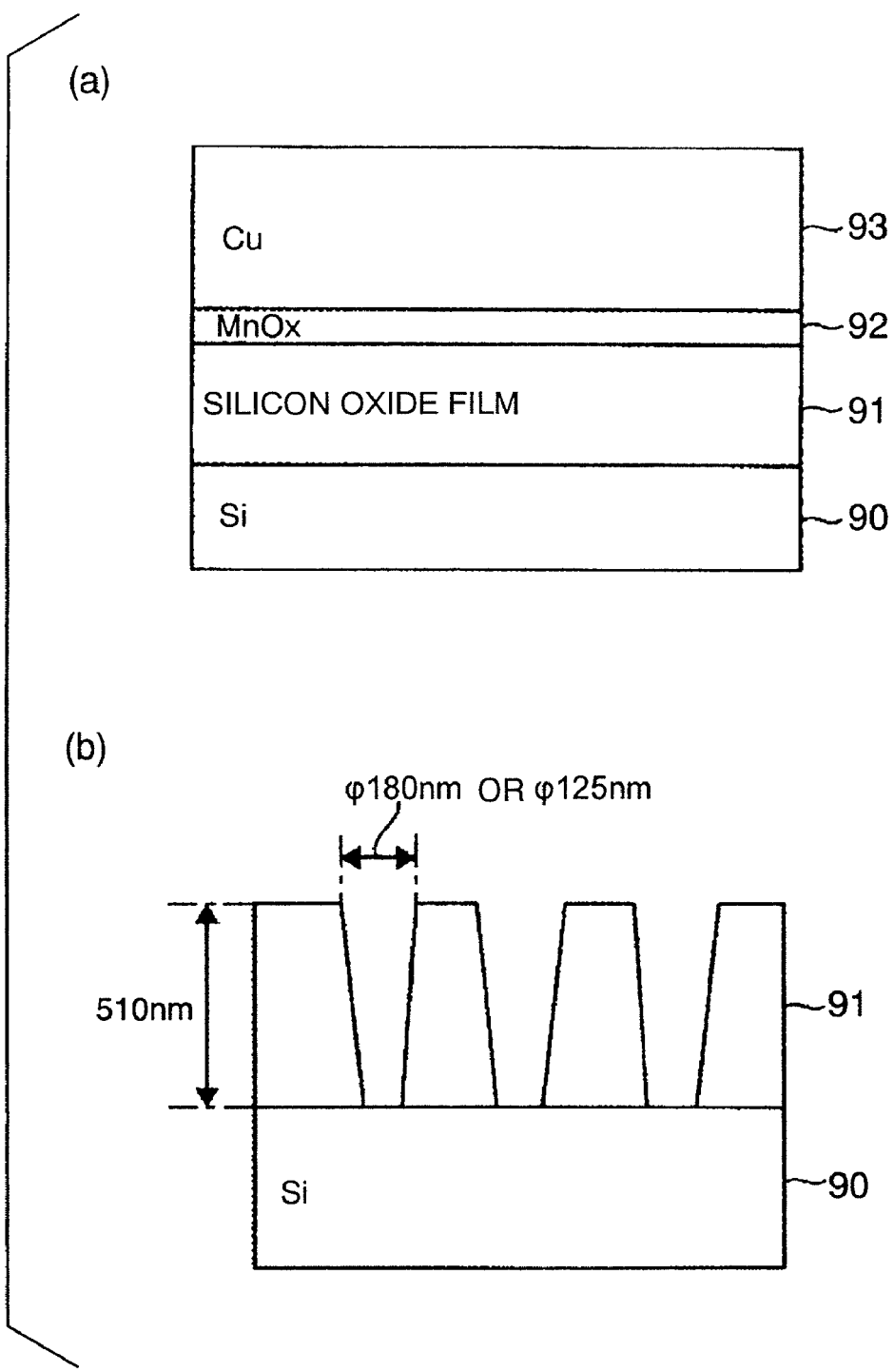
FIG. 8 is a sectional view schematically showing the structure of a wafer used in an example of the present invention.

Separately from the above three kinds of wafers W, wafers W, as shown in FIG. 8(b), for confirming a step coverage were prepared, and a step coverage of a deposited film was inspected with the use of the wafers W. The wafer W was formed by depositing, on a silicon substrate, a silicon oxide film 91 made of plasma TEOS, such that the silicon oxide film had a thickness of 510 nm. Small holes are patterned in the plasma TEOS film. On the silicon oxide film 91, there was deposited manganese oxide 92 in the aforementioned Cu=MnOxCVD module 5 under the aforementioned film deposition conditions (the film deposition temperatures were 200° C. and 400° C.). A section of the wafer W manufactured in this manner was observed by using a TEM (Transmission Electron Microscopy).

In both the wafers W on which the films had been deposited at 200° C. and 400° C., a very thin manganese oxide layer 92 of about 5 nm in thickness was confirmed along the surface of the silicon oxide film 91, which is shown in FIG. 8(b), in which small holes each having a diameter of about 180 nm and an aspect ratio (ratio obtained from a width and a depth of the hole) of about 2.8 were patterned, or along the surface of the silicon oxide film 91 in which small holes each having a diameter of about 125 and an aspect ratio of about 4.0 were patterned. The surface of the film was a smooth continuous film without irregularities. Thus, due to the formation of the aforementioned barrier film 26 by such a method, a film can be deposited with an excellent step coverage even for small hole pattern.

Reference Experiment

Confirmation of Base Dependency of Film Thickness of Manganese Oxide)

The organic metal compound of manganese used in the present invention is characterized in that it reacts with a film containing oxygen for a relatively short period of time so as to generate the manganese oxide 25, which is as described above, and that it does not react with a film containing no oxygen for a relatively short period of time. Thus, the following reference experiment was conducted in order to confirm the characteristic feature.

In the experiment, the below-described three kinds of samples were used as wafers W. In the aforementioned Cu—MnOxCVD module 5, a manganese oxide film was deposited under the following film deposition conditions. Thereafter, a thickness of the manganese adhering to the film was calculated for each sample.

Figure 17:
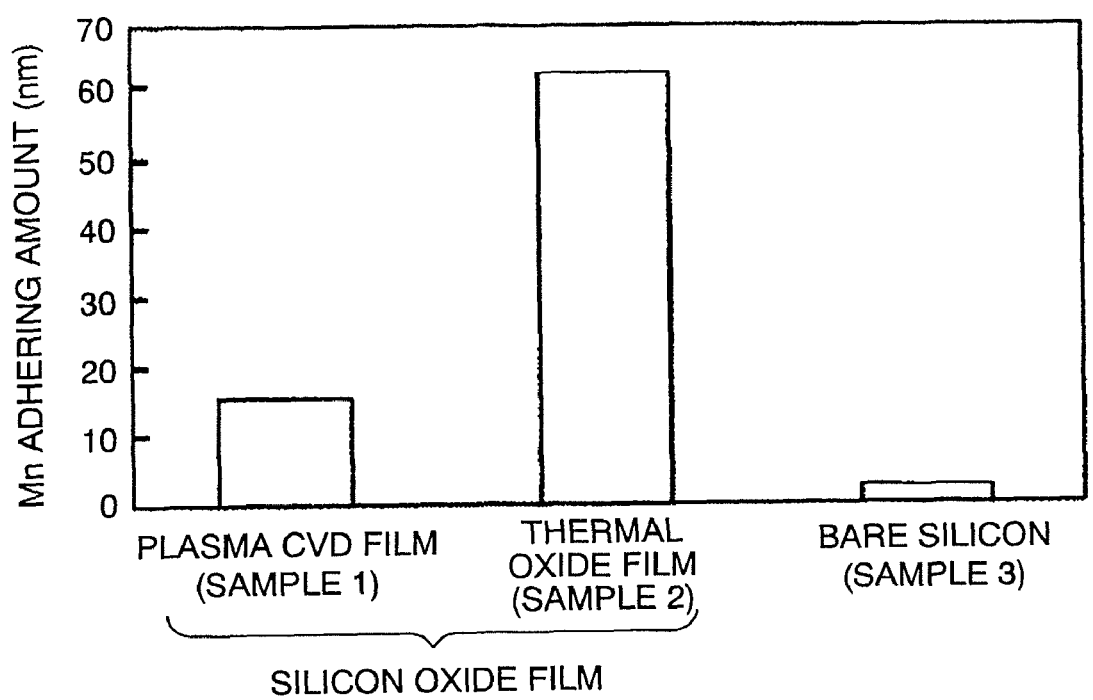
FIG. 17 is a characteristic view showing a result obtained in the example.

(Samples)
1. Silicon oxide film deposited by the aforementioned plasma CVD method using TEOS
2. Silicon oxide film formed by thermally processing a bare silicon under an oxidized atmosphere
3. Unprocessed bare silicon (Film Deposition Conditions)
Precursor (material): $(EtCp)_2Mn$
Carrier Gas: $H_2$, 25 sccm
Film Deposition Temperature: 500° C.
Process Pressure: 133 Pa (1 Torr)
Film Deposition Period: 30 minutes Experiment Result As shown in FIG. 17, a larger amount of manganese adhered to Samples 1 and 2 containing oxygen. Meanwhile, a smaller amount of manganese adhered to Sample 3 containing no oxygen. Thus, the above-described characteristic feature of the organic metal compound of manganese was confirmed. One of the reasons for the fact that the manganese adhered to Sample 3 containing no oxygen is such a high film deposition temperature as to invite abnormal grain growth.

Although Samples 1 and 2 were silicon oxide films of the same kind, the amounts of manganese adhering to the films differed depending on the film deposition methods. The reason therefore can be considered that there is a difference between the amounts of oxygen in the silicon oxide films, depending on the different film deposition methods.

From this experiment, it can be considered that, when a reducing process or an etching process is performed such that the aforementioned copper wiring 13 contains only a slight amount of oxygen, while preventing formation of a natural oxide film on the copper wiring 13, and the barrier film 26 is deposited at a low temperature less than 500° C., generation of the manganese oxide 25 on the surface of the copper wiring 13 can be prevented, whereby the barrier film 26 can be selectively grown on the film containing oxygen.

Experiment 5

Embodiment Experiment in Sample of Dual Damascene Structure

Figure 18:
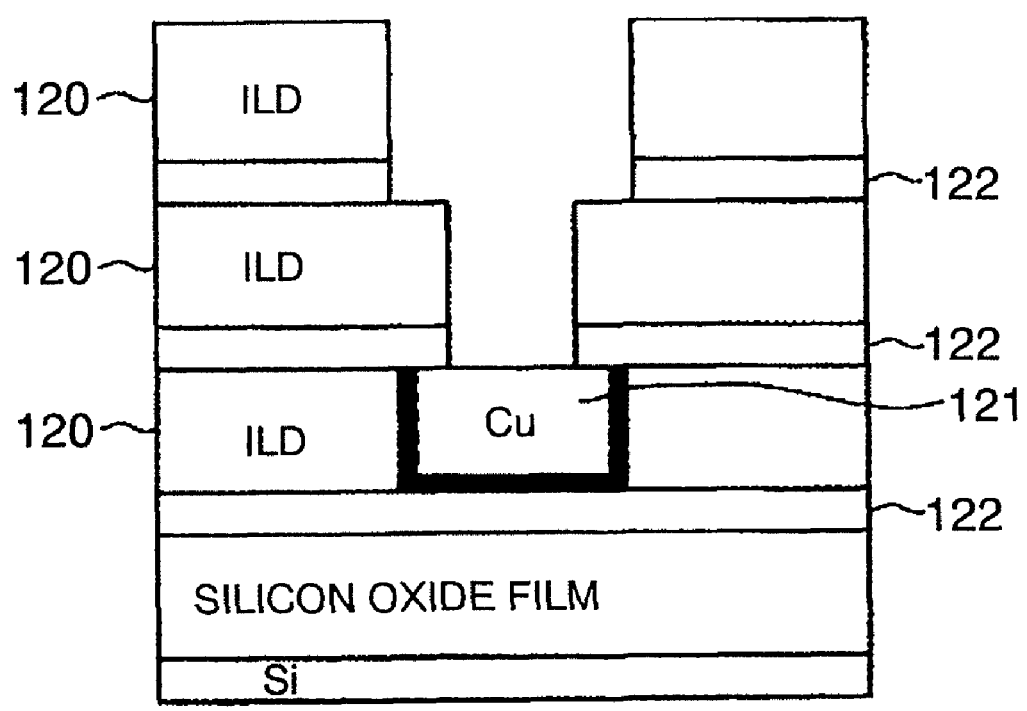
FIG. 18 is a longitudinal sectional view schematically showing a wafer used in the example.
Figure 19:
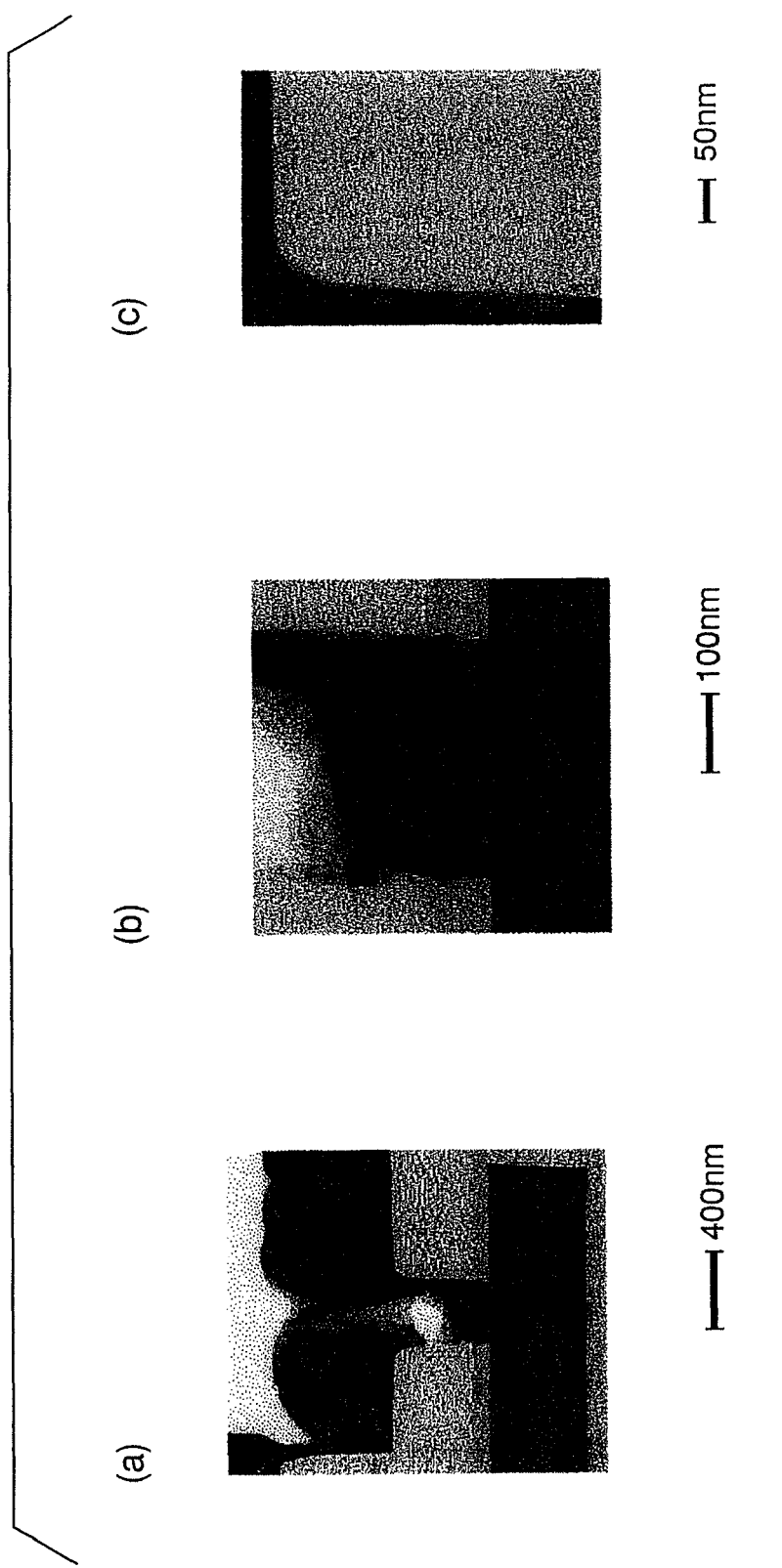
FIG. 19 is TEM picture view of a longitudinal section of the wafer.
Figure 20:
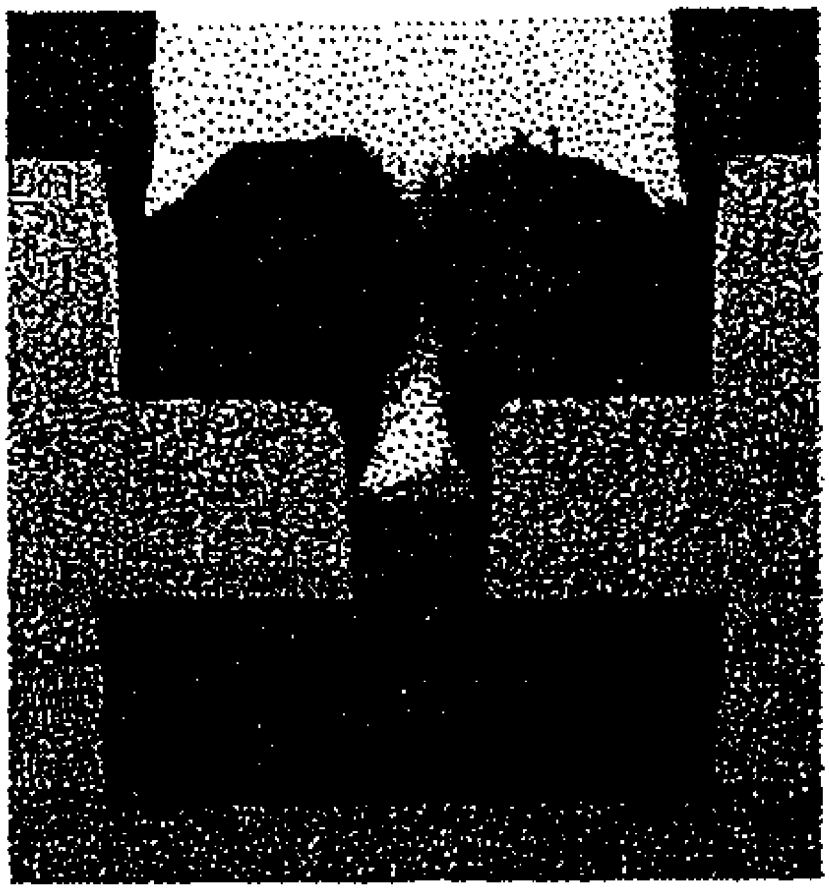
FIG. 20 is a TEM picture view of the longitudinal section of the wafer.

A. Experiment Procedure/Experiment Conditions
(1) Dual Damascene Specimen
A sample of a dual damascene specimen as shown in FIG. 18 was purchased from SEMATECH. The reference number 120 depicts an interlayer insulation film made of silicon oxide, 121 depicts a Cu wiring part, and 122 depicts a SiN film.
(2) CVD-Mn Deposition
Mn was deposited on the dual-damascene structure sample under the following conditions. The film deposition conditions were as follows.
Base: SEMATECH pattern 800 AZ
Precursor: $(EtCp)_2Mn$
Temperature in Precursor Bottle: 80° C. (measured by a thermocouple)
Supply Method Bubbling
Bubbling gas: $H_2$, 25 SCCM
Substrate Temperature: 200° C.
Process Pressure: 133 Pa (1 torr)
Film Deposition Period: 10 min
(3) PVD-Cu Deposition (Cap Cu Deposition)
Cu was deposited to form a protective film by the sputtering method on the CVD-Mn film deposited on the sample, without exposing the sample to an atmospheric air.
The film deposition conditions were as follows.
Substrate Temperature: Room Temperature
Film Thickness: 500 nm
(4) Annealing Process
After the deposition of the PVD-Cu, an annealing process was performed.
The annealing conditions were as follows.
Gas Flow Rate: Ar, 50 SCCM
Substrate Temperature: 400° C.
Pressure: 667 Pa (5 Torr)
Period: 20 minutes (for raising temperature)+40 minutes (for maintaining temperature)
(5) Measurement
Measuring Equipment for Observing Section: Transmission Electron Microscope (TEM)
Measuring Equipment for Analyzing Element: Energy Dispersive X-ray Spectroscopy (EDX)
B. Experiment Result
FIGS. 19(a) to 19(c) are TEM pictures of the samples processed as above. FIG. 19(a) shows a via hole and a trench part in enlargement, FIG. 19(b) shows a portion around a bottom part of the via hole in enlargement, and FIG. 19(c) shows an area ranging from a sidewall of the via hole to a bottom part of the trench in enlargement. FIG. 20 shows the via hole and the trench as a whole, including the Cu wiring in the lower layer.

It was found that a Mn compound film of 3 to 4 nm in thickness existed on an interface between the copper and the interlayer insulation film (silicon oxide film). The thickness of the continuous thin film formed of the Mn composite film was 3 to 4 nm at both positions of the uppermost surface of the interlayer insulation film and the inner wall of the via hole. Thus, the Mn composite film provided an excellent step coverage.

It was found that a Mn layer present on an interface between the lower copper wiring (M1-Cu) and the PVD-Cu (M2-Cu) was not a continuous thin film but a discontinuous layer having a thickness of 5 to 10 nm, with obscure upper and lower interfaces.

There existed an interface on which continuous Cu crystal grains existed from the lower copper wiring (M1-Cu) to the PVD-Cu (M2-Cu), although not the overall bottom part of the via hole. Namely, it can be said that there were formed electric paths extending from the lower copper wiring (M1-Cu) to reach the copper in the via hole through the Mn layer.

Figure 21:
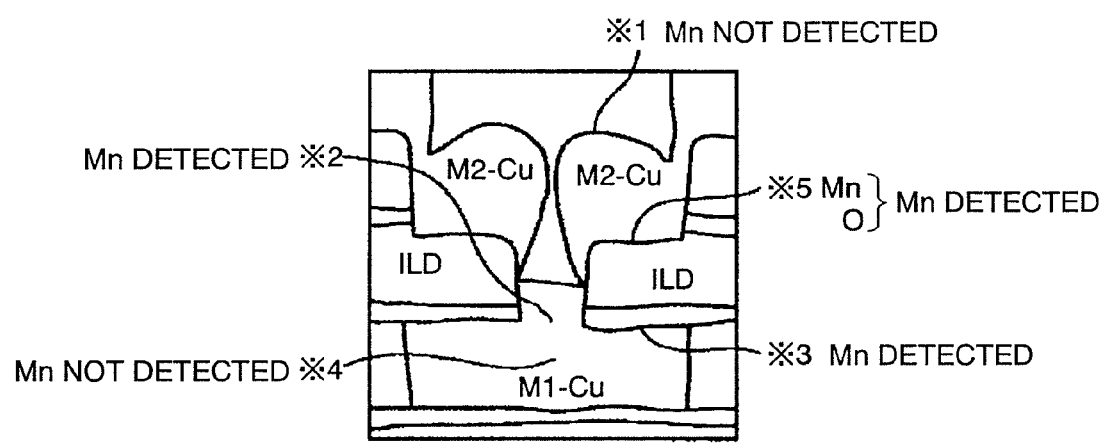
FIG. 21 is a schematic view of the longitudinal section of the wafer.

From the above data, it can be said that it is possible to selectively grow a Mn composite on an interlayer insulation film (silicon oxide film) of a damascene structure. Elements in a longitudinal section of the sample were analyzed by means of an EDS. Shown below is a result thereof. FIG. 21 is a schematic view showing measuring points. At the measuring points X1 and X4, Mn was not detected, while at the measuring points X2, X3, and X5, Mn was detected. Thus, it was found that, when detected by an EDS level equipment, Mn did not exist in the center of the wiring layer of Cu, but diffused therearound. In addition, it was estimated that a part of Mn remained on the bottom of the via hole. Further, since O (oxygen) was detected at the measuring point X5, it was found that a barrier film containing Mn and O was formed on the surface of the interlayer insulation film.

Experiment 6

Experiment of Depositing Manganese Compound on Cu Solid Film

Figure 22:
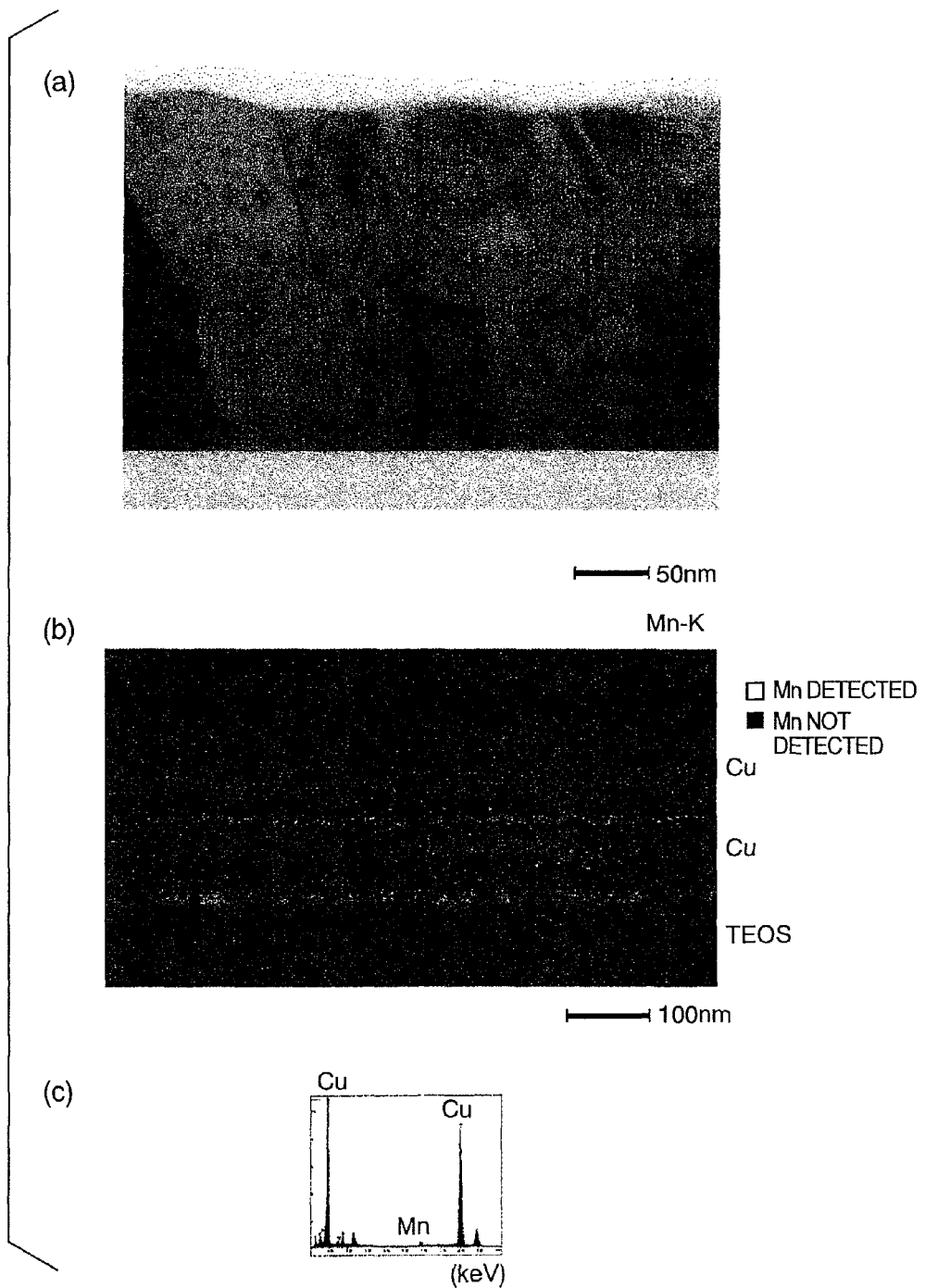
FIG. 22 is a characteristic view showing a result obtained in the example.

A. Experiment Procedure/Experiment Conditions
(1) Substrate
  A substrate in which a p (plasma CVD)-TEOS film was formed over all the surface of a Bare-Si film was prepared.
(2) PVD-Cu Deposition (Lower Layer)
  Lower PVD-Cu was deposited under the following conditions.
Film Thickness: 100 nm
Substrate Temperature: Room Temperature
Post Process Without Annealing Process
(3) CVD-Mn Deposition
  CVD-Mn was deposited under the following conditions. The film deposition conditions were the same as those described in the item (2) of Experiment 5, excluding the conditions of the base.
(4) PVD-Cu Deposition (Upper Layer)
  Upper PVD-Cu was deposited under the following conditions.
Film Thickness: 100 nm
Substrate Temperature: Room Temperature
Post Process Without Annealing Process
(5) Measurement
Measuring Equipment for Observing Section: Transmission Electron Microscope (TEM)
Measuring Equipment for Analyzing Element: Energy Dispersive X-ray Spectroscopy (EDX)
B. Experiment Result
  FIG. 22(a) is a TEM picture picturized such that an interface between the upper PVD-Cu layer and the lower PVD-Cu layer is positioned at a center. FIG. 22(b) is an image view in which a Mn—K ray signal is visualized. FIG. 22(c) shows an analysis result by the EDX showing a part of the lower PVD-Cu layer at a position below about 50 nm from the interface shown in FIG. 22(a). From this result, it was found that the CVD-Mn layer existed as a film of 5 to 10 nm in thickness having obscure interfaces, along an interface between the lower PVD-Cu layer and the upper PVD-Cu layer. From the lower PVD-Cu layer to the upper PVD-Cu layer, continuous Cu crystal grains existed. This shows that the CVD-Mn layer was not a continuous film but a discontinuous film, and that there were formed electric paths extending from the lower copper wiring to reach the upper copper wiring through the CVD-Mn film. From the EDX data, it was found that the obscure layer on the interface between the lower Cu layer and the upper Cu layer and the PVD-Cu/p-TEOS interface contained Mn. As a result, it can be considered that Mn adhering to (depositing on) the PVD-Cu during the Mn deposition was solidly dissolved in Cu and dispersed, so as to precipitate (segregate) on the Cu/p-TEOS interface.

In addition, from the EDX data, it is considered that the Mn—K ray signal from a bulk part of Cu (part other than the interfaces) was a noise level, so that little amount of manganese remained in the bulk of Cu.

Based on the above result, even when the CVD-Mn film is present on the interface between the lower Cu layer and the upper Cu layer, it can be considered that the CVD-Mn film provides a significantly small electric resistance or almost no resistance.

This experiment demonstrates that a manganese compound film is not formed on a copper film. On the other hand, Experiments 1, 2, and 3 as described above respectively demonstrate that a manganese compound film is formed on a silicon oxide film. In view of these results in comparison, it can be understood that it is possible to selectively grow a manganese compound on an insulation (dielectric) film of a damascene structure.

(Experiment 7

Experiment of Verifying Relationship between Film Deposition Period and Film Thickness A. Experiment Procedure/Experiment Conditions
(1) Preparation of Sample There was prepared as a sample a substrate on which an insulation film (p-TEOS film) was formed over all the surface thereof.
(2) CVD-Mn Deposition
  Mn was deposited under the following conditions.
Substrate Temperature: 200° C.
Pressure: 133 Pa (1 torr)
Carrier Gas Flow Rate: $H_2$, 25 SCCM
Film Deposition Period: 0.3 minutes (20 seconds) to 30 minutes
(3) Measurement of Film Thickness
Method of Measurement: X-ray Fluorescence Analysis (XRF)
B. Experiment Result
  On the p-TEOS film, the film thickness of the manganese compound does not depend on the film deposition period, and is substantially constant. It is sufficient that the film deposition period is performed for about 20 seconds. The increase of the film thickness is self-limited.

Experiment 8

Experiment of Verifying Relationship between Film Deposition Period and Specific Resistance of Copper A. Experiment Procedure/Experiment Conditions
(1) Preparation of Sample
  There was prepared as a sample a substrate in which a Cu film was formed over all the surface thereof.

(2) CVD-Mn Deposition

Mn was deposited under the following conditions.

Substrate Temperature: 200° C.

Pressure: 133 Pa (1 torr)

Carrier Gas Flow Rate: $H_2$, 25 SCCM

Film Deposition Period: 0.3 minutes (20 seconds) to 30 minutes (3) Measurement of Specific Resistance A specific resistance of the copper film was measured by a four-terminal method.

B. Experiment Result

Figure 23:
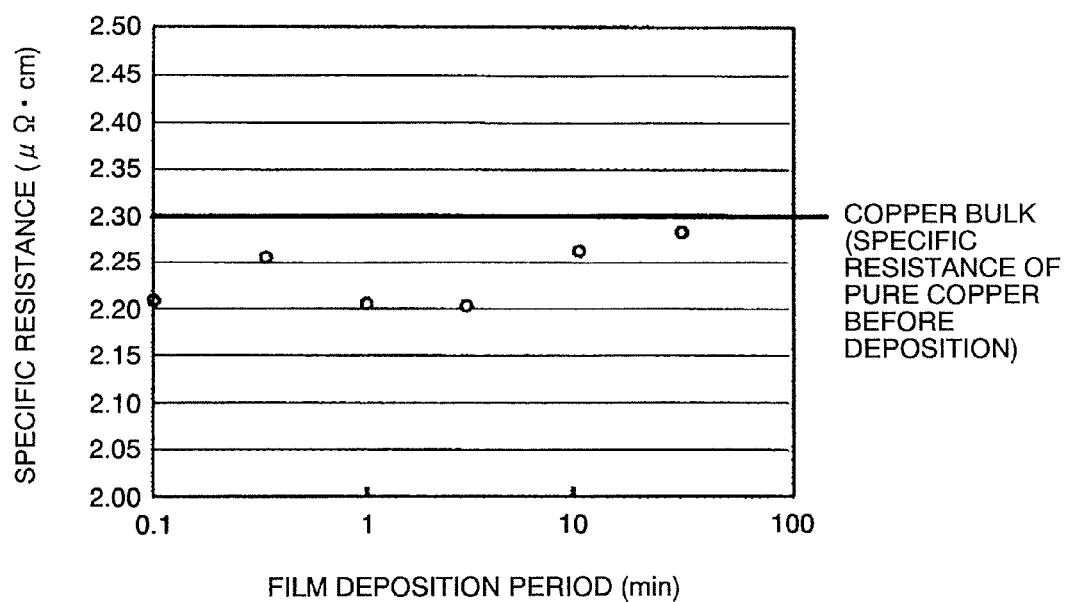
FIG. 23 is a characteristic view showing a specific resistance of a copper film obtained in the example.

As shown in FIG. 23, even when the film deposition period is increased, specific resistance is substantially constant. The reason therefore is estimated that Mn is solidly dissolved and dispersed in the Cu layer, whereby the Mn is eliminated from the Cu. Based on the aforementioned result shown in FIG. 22(c), the eliminated Mn is estimated to segregate on the Cu/p-TEOS interface. Thus, it is considered that the specific resistance of the Cu is as low as that of pure Cu. When impurity such as Mn is present in Cu, the specific resistance is increased.

The above result demonstrates that the CVD-Mn step does not cause increase of electric resistance of a Cu wiring, whereby it can be expected that the CVD-Mn step is applied to a semiconductor device.

The invention claimed is:

1. A method of manufacturing a semiconductor device, performed to a substrate including: an interlayer insulation film having a recess formed therein; and a lower metal wiring, in a lower layer, whose main component is a first metal, the lower metal wiring being exposed to a bottom surface of the recess; the method comprising:

forming a barrier film, which is a compound of a second metal and is configured to restrain diffusion of the first metal, on an exposed surface of the interlayer insulation film, by supplying a steam of an organic metal compound containing the second metal so as to react the organic metal compound containing the second metal with a part of components of the interlayer insulation film; and then, embedding a metal wiring whose main component is the first metal in the recess.

2. The method of manufacturing a semiconductor device according to claim 1, wherein, in the forming of the barrier film, since the lower wiring layer does not contain a component that will react with the organic metal compound containing the second metal so as to form a compound of the second metal, the barrier film is not formed on the lower metal wiring exposed to the bottom surface of the recess.

3. The method of manufacturing a semiconductor device according to claim 1, further comprising, before the forming of the barrier film, removing or reducing oxygen on the surface of the metal wiring by reducing or etching a metal oxide on a surface of the lower metal wiring whose main component is the first metal that is exposed to the bottom surface of the recess formed in the interlayer insulation film on the substrate.

4. The method of manufacturing a semiconductor device according to claim 3, wherein the metal oxide on the surface of the lower metal wiring is generated when the substrate is transferred in an atmosphere.

5. The method of manufacturing a semiconductor device according to claim 3, wherein the metal oxide on the surface of the lower metal wiring is generated by an etching process that supplies the interlayer insulation film with a plasma of a process gas containing oxygen so as to form the recess, the etching process being performed before the removing or reducing of the oxygen on the surface of the metal wiring.

6. The method of manufacturing a semiconductor device according to claim 3, wherein the process that removes or reduces the oxygen on the surface of the metal wiring is a process that supplies an organic acid to the recess.

7. The method of manufacturing a semiconductor device according to claim 6, wherein the organic acid is formic acid.

8. The method of manufacturing a semiconductor device according to claim 3, wherein the process that removes or reduces the oxygen on the surface of the metal wiring is a thermal process that supplies hydrogen to the recess or a process that etches the recess by sputtering with argon.

9. The method of manufacturing a semiconductor device according to claim 1, wherein between the forming of the barrier film and the embedding metal wiring whose main component is the first metal, a seed layer made of the first metal is formed on the surface of the interlayer insulation film and inside the recess.

10. The method of manufacturing a semiconductor device according to claim 1, wherein the interlayer insulation film contains oxygen or carbon.

11. The method of manufacturing a semiconductor device according to claim 1, wherein a part of components near the surface of the interlayer insulation film or in the interlayer insulation film is oxygen, a compound containing an oxygen atom such as water, or carbon.

12. The method of manufacturing a semiconductor device according to claim 1, wherein the first metal is one or more metals selected from the group consisting of Al, Cu, and Ag.

13. The method of manufacturing a semiconductor device according to claim 1, wherein the second metal is one or more metals selected from the group consisting of Mg, Al, Ti, V, Cr, Mn, Ni, Ge, Y, Zr, Nb, Tc, Rh, Pd, Sn, Re, and Pt.

14. The method of manufacturing a semiconductor device according to claim 1, wherein in the forming of the barrier film, the substrate is heated.

15. The method of manufacturing a semiconductor device according to claim 1, wherein the organic metal compound containing the second metal does not contain oxygen.

16. The method of manufacturing a semiconductor device according to claim 1, wherein the organic metal compound containing the second metal reacts and decomposes by a presence of oxygen.

17. The method of manufacturing a semiconductor device according to claim 1, wherein the interlayer insulation film is made of one or more films selected from the group consisting of a SiO film, a SiOF film, a SiC film, a SiOC film, a SiCOH film, a SiCN film, a porous silica film, a porous methylsilsesquioxane film, a poly-arylene film, a SiLK (registered trademark) film, and a fluorocarbon film.

18. The method of manufacturing a semiconductor device according to claim 1, wherein the organic metal compound containing the second metal is made of one or more organic metal compounds selected from the group consisting of $Cp_2Metal[Metal(C_5H_5)_2]$, (MeCp)$_2$Metal [=Metal(CH$_3$C$_5$H$_4$)$_2$], (Me$_5$Cp)$_2$Metal [=Metal ((CH$_3$)$_5$C$_5$H$_4$)$_2$], (EtCp)$_2$Metal[=Metal(C$_2$H$_5$C$_5$H$_4$)$_2$], (i-PrCp)$_2$Metal [=Metal (C$_3$H$_7$C$_5$H$_4$)$_2$], (t-BuCp)$_2$Metal[=Metal(C$_4$H$_9$C$_5$H$_4$)$_2$], Metal(DMPD) (EtCp)[=Metal(C$_7$H$_{11}$C$_2$H$_5$C$_5$H$_4$)] (herein "Metal" means the second metal element).

19. The method of manufacturing a semiconductor device according to claim 1, wherein
the first metal is Cu and the second metal is Mn.

20. The method of manufacturing a semiconductor device according to claim 1, further comprising,
after the forming of the barrier film, starting to supply a steam of an organic metal compound containing the first metal and then increasing the supply amount of the steam of the organic metal compound containing the first metal, while heating the substrate and supplying the steam of the organic metal compound containing the second metal, so as to form a contact layer in which a ratio of the first metal relative to the second metal is gradually increased toward a surface layer.

21. The method of manufacturing a semiconductor device according to claim 1, further comprising a thermal (annealing) process after the embedding of the metal wiring.

22. The method of manufacturing a semiconductor device according to claim 1, wherein
the forming of the barrier film includes heating of the substrate at not less than 100° C. and less than 500° C.

23. The method of manufacturing a semiconductor device according to claim 1, wherein
the barrier film is amorphous.

24. The method of manufacturing a semiconductor device according to claim 1, wherein
the barrier film is not more than 5 nm in a film thickness thereof.

25. A semiconductor device manufactured by the method of manufacturing a semiconductor device according to claim 1.

26. An electronic instrument including the semiconductor device according to claim 25.

27. A semiconductor manufacturing apparatus for performing the manufacturing method according to claim 1, the semiconductor manufacturing apparatus comprising:
a vacuum transfer chamber module including: a transfer chamber of a vacuum atmosphere to which a substrate is loaded; and substrate transfer unit disposed in the transfer chamber;
a barrier-film forming module including: a processing vessel air-tightly connected to the vacuum transfer chamber module, the processing vessel having therein a table on which the substrate is placed; and a unit that supplies the substrate with a steam of an organic metal compound containing a second metal; the barrier-film forming module being configured to form a barrier film, which is a compound of the second metal and is configured to restrain diffusion of a first metal, on an exposed surface of an interlayer insulation film on the substrate, by unit of a reaction of a part of components of the interlayer insulation film with the organic metal compound containing the second metal;
a first metal-wiring forming module including: a processing vessel air-tightly connected to the vacuum transfer chamber module, the processing vessel having therein a table on which the substrate is placed; a unit that heats the substrate; and a first metal-wiring forming unit that supplies the substrate with a steam of a material whose main component is a first metal so as to embed the material whose main component is the first metal in the recess; and
a control device that controls the substrate transfer unit such that the substrate having loaded into the vacuum transfer chamber module is transferred to the barrier-film forming module, and then the substrate is transferred to the first metal-wiring forming module via the vacuum transfer chamber module.

28. The semiconductor manufacturing apparatus according to claim 27, further comprising a pre-processing module air-tightly connected to the vacuum transfer chamber module, the pre-processing module including therein a reducing unit or a removing unit that reduces or etches a metal oxide on a surface of a lower metal wiring whose main component is a first metal, the surface being exposed to a bottom surface of a recess formed in the interlayer insulation film on the substrate; and
before the substrate is transferred to the barrier-film forming module, the control device controls the substrate transfer unit such that the substrate is transferred to the pre-processing module via the vacuum transfer chamber module.

29. The semiconductor manufacturing apparatus according to claim 27, further comprising a seed-layer forming module air-tightly connected to the vacuum transfer chamber module, the seed-layer forming module including therein a seed-layer forming unit that forms a seed layer whose main component is the first metal on the surface of the interlayer insulation film and inside the recess, and
the control device controls the substrate transfer unit such that, after the substrate has been transferred to the barrier-film forming module and before the substrate is transferred to the first metal-wiring forming module, the substrate is transferred to the seed-layer forming module via the vacuum transfer chamber module.

30. The semiconductor manufacturing apparatus according to claim 27, wherein
the processing vessel of the barrier-film forming module also serves as the processing vessel of the first metal-wiring forming module.

31. The semiconductor manufacturing apparatus according to claim 27, wherein
the interlayer insulation film contains oxygen or carbon.

32. The semiconductor manufacturing apparatus according to claim 27, wherein
a part of components near the surface of the interlayer insulation film or in the interlayer insulation film is oxygen, a compound containing an oxygen atom such as water, or carbon.

33. The semiconductor manufacturing apparatus according to claim 27, wherein
the first metal is one or more metals selected from the group consisting of Al, Cu, and Ag.

34. The semiconductor manufacturing apparatus according to claim 27, wherein
the second metal is one or more metals selected from the group consisting of Mg, Al, Ti, V, Cr, Mn, Ni, Ge, Y, Zr, Nb, Tc, Rh, Pd, Sn, Re, and Pt.

35. The semiconductor manufacturing apparatus according to claim 27, wherein
the barrier-film forming module includes a unit that heats the substrate.

36. The semiconductor manufacturing apparatus according to claim 27, wherein
the organic metal compound containing the second metal does not contain oxygen.

37. The semiconductor manufacturing apparatus according to claim 27, wherein
the organic metal compound containing the second metal reacts and decomposes by a presence of oxygen.

38. The semiconductor manufacturing apparatus according to claim 27, wherein
the interlayer insulation film is made of one or more films selected from the group consisting of a SiO film, a SiOF film, a SiC film, a SiOC film, a SiCOH film, a SiCN film, a porous silica film, a porous methylsilsesquioxane film, a poly-arylene film, a SiLK (registered trademark) film, and a fluorocarbon film.

39. The semiconductor manufacturing apparatus according to claim 27, wherein
the organic metal compound containing the second metal is made of one or more organic metal compounds selected from the group consisting of $Cp_2Metal[Metal(C_5H_5)_2]$, $(MeCp)_2Metal\ [=Metal(CH_3C_5H_4)_2]$, $(Me_5Cp)_2Metal\ [=Metal\ ((CH_3)_5C_5H_4)_2]$, $(EtCp)_2Metal[=Metal(C_2H_5C_5H_4)_2]$, $(i\text{-}PrCp)_2Metal\ [=Metal\ (C_3H_7C_5H_4)_2]$, $(t\text{-}BuCp)_2Metal[=Metal(C_4H_9C_5H_4)_2]$, $Metal(DMPD)(EtCp)[=Metal(C_7H_{11}C_2H_5C_5H_4)]$ (herein "Metal" means the second metal element).

40. The semiconductor manufacturing apparatus according to claim 27, wherein
the first metal is Cu and the second metal is Mn.

41. The semiconductor manufacturing apparatus according to claim 27, wherein
the reducing unit or the removing unit is a unit that supplies an organic acid to the recess.

42. The semiconductor manufacturing apparatus according to claim 27, wherein
the reducing unit or the removing unit is a unit that supplies hydrogen to the recess, or a unit that etches the recess by sputtering with argon.

43. The semiconductor manufacturing apparatus according to claim 41, wherein
the organic acid is formic acid.

44. The semiconductor manufacturing apparatus according to claim 27, further comprising an annealing unit airtightly connected to the vacuum transfer chamber module, the annealing unit including therein a heating unit that heats the substrate, and
the control device controls the substrate transfer unit such that, after the substrate has been transferred to the first metal-wiring forming module, the substrate is transferred to the annealing unit via the vacuum transfer chamber module.

45. The semiconductor manufacturing apparatus according to claim 27, wherein
the barrier-film forming module includes a heating unit that heats the substrate at not less than 100° C. and less than 500° C.

46. The semiconductor manufacturing apparatus according to claim 27, wherein
the barrier film is amorphous.

47. The semiconductor manufacturing apparatus according to claim 27, wherein
the barrier film is not more than 5 nm in a film thickness thereof.

48. A storage medium for use in a semiconductor manufacturing apparatus for processing a substrate, the storage medium storing a computer program executable on a computer,
wherein the computer program includes a step group such that the method of manufacturing a semiconductor device according to claim 1 is performed.

* * * * *